(12) United States Patent
Yu et al.

(10) Patent No.: US 12,094,778 B2
(45) Date of Patent: Sep. 17, 2024

(54) FIN FIELD-EFFECT TRANSISTOR DEVICE AND METHOD OF FORMING

(71) Applicant: Taiwan Semiconductor Manufacturing Co., Ltd., Hsinchu (TW)

(72) Inventors: Jeng-Wei Yu, New Taipei (TW); Yi-Fang Pai, Hsinchu (TW); Pei-Ren Jeng, Chu-Bei (TW); Chii-Horng Li, Zhubei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 395 days.

(21) Appl. No.: 17/490,922

(22) Filed: Sep. 30, 2021

(65) Prior Publication Data

US 2022/0415715 A1 Dec. 29, 2022

Related U.S. Application Data

(60) Provisional application No. 63/214,508, filed on Jun. 24, 2021.

(51) Int. Cl.
*H01L 21/8234* (2006.01)
*H01L 27/088* (2006.01)
*H01L 29/66* (2006.01)
*H01L 29/78* (2006.01)

(52) U.S. Cl.
CPC ......... *H01L 21/823418* (2013.01); *H01L 21/823431* (2013.01); *H01L 27/0886* (2013.01); *H01L 29/66795* (2013.01); *H01L 29/7851* (2013.01)

(58) Field of Classification Search
CPC ..... H01L 21/823418; H01L 21/823431; H01L 27/0886; H01L 29/66795; H01L 29/7851; H01L 29/0847; H01L 29/785; H01L 21/823475
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 2014/0282326 A1 | 9/2014 | Chen et al. |

(Continued)

*Primary Examiner* — Karen Kusumakar
*Assistant Examiner* — Adam S Bowen
(74) *Attorney, Agent, or Firm* — Slater Matsil, LLP

(57) ABSTRACT

A method of forming a fin field-effect transistor device includes: forming a gate structure over a first fin and a second fin; forming, on a first side of the gate structure, a first recess and a second recess in the first fin and the second fin, respectively; and forming a source/drain region in the first and second recesses, which includes: forming a barrier layer in the first and second recesses; forming a first epitaxial material over the barrier layer, where a first portion of the first epitaxial material over the first fin is spaced apart from a second portion of the first epitaxial material over the second fin; forming a second epitaxial material over the first and second portions of the first epitaxial material, where the second epitaxial material extends continuously from the first fin to the second fin; and forming a capping layer over the second epitaxial material.

20 Claims, 21 Drawing Sheets

(56) References Cited

U.S. PATENT DOCUMENTS

| | | | |
|---|---|---|---|
| 2019/0252240 A1* | 8/2019 | Lee | H01L 29/0653 |
| 2019/0393347 A1* | 12/2019 | Kim | H01L 27/0886 |
| 2020/0105606 A1* | 4/2020 | Lin | H01L 29/0649 |

* cited by examiner

FIN FIELD-EFFECT TRANSISTOR DEVICE AND METHOD OF FORMING

PRIORITY CLAIM AND CROSS-REFERENCE

This application claims priority to U.S. Provisional Patent Application No. 63/214,508, filed Jun. 24, 2021 and entitled "Innovative Shape Design In Source-Drain NEPI for 3 nm Device and Beyond," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
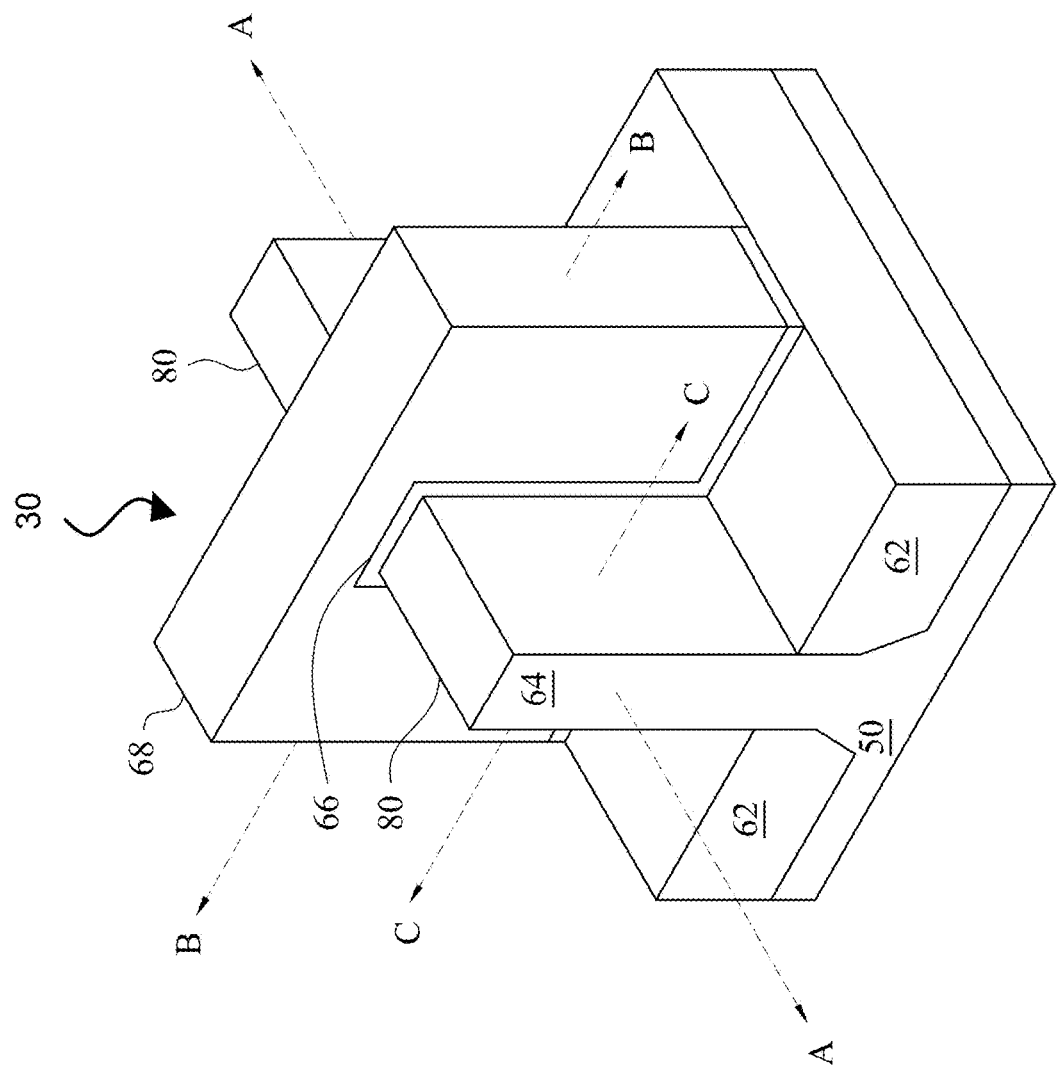
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same reference numeral in different figures refers to the same or similar component formed by a same or similar method using a same or similar material(s).

In some embodiments, the source/drain region of a FinFET device that have multiple fins is formed by: forming recesses in each of the fins, forming a barrier layer in the recesses, forming a plurality of discrete portions of a first epitaxial material over each of the fins on the barrier layer, forming a second epitaxial material over the first epitaxial material and connecting the plurality of discrete portions of the first epitaxial material, and forming a capping layer over the second epitaxial material. In some embodiments, chemical compositions of the first epitaxial material, the second epitaxial material, and the capping layer all include a semiconductor material (e.g., silicon) and a dopant (e.g., phosphorous), but having different dopant concentrations. A first dopant concentration in the first epitaxial material is lower than a second dopant concentration in the second epitaxial material, and a third dopant concentration in the capping layer is lower than the first dopant concentration. The discrete portions of the first epitaxial material allow an air gap to be formed in-between, which reduces the gate-to-drain capacitance of the device formed. The second epitaxial material is formed to have a high dopant concentration and to merge between the discrete portions of the first epitaxial material, which reduces the electrical resistance of the source/drain contact plugs formed.

FIG. 1 illustrates an example of a Fin Field-Effect Transistor (FinFET) 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-5, 6A, 6B, 7A, 7B, 8-10, 11A, 11B, 12-14, 15A, 15B, and 15C illustrate various cross-sectional views of a FinFET device 100 at various stages of fabrication, in accordance with an embodiment. The FinFET device 100 is similar to the FinFET 30 in FIG. 1, but with multiple fins and multiple gate structures. FIGS. 2-5 and 15B illustrate cross-sectional views of the FinFET device 100 along cross-section B-B. FIGS. 6A, 7A, 11B, 12-14, and 15A illustrate cross-sectional views of the FinFET device 100 along cross-section A-A. FIGS. 6B, 7B, 8-10, 11A, and 15C illustrate cross-sectional views of the FinFET device 100 along cross-section C-C. Throughout the discussion herein, unless otherwise specified, figures with the same reference number but different alphabets (e.g., FIGS. 6A and 6B) refer to different cross-sectional views of a same device at a same stage of fabrication.

Figure 2:
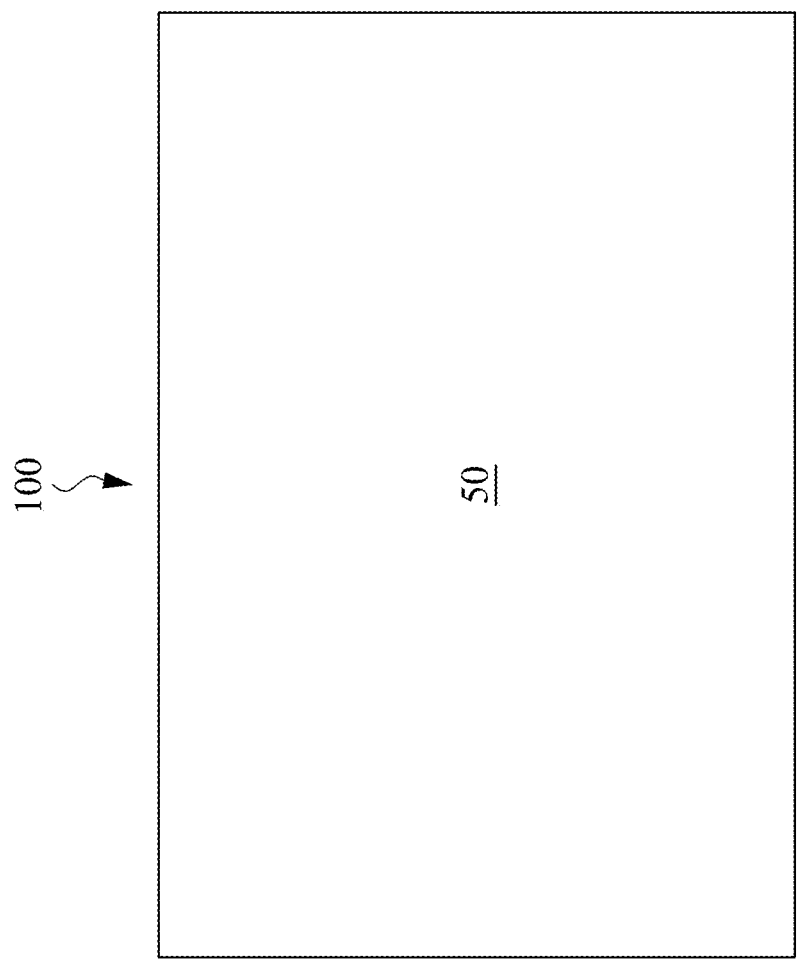
FIGS. 2-5, 6A, 6B, 7A, 7B, 8-10, 11A, 11B, 12-14, 15A, 15B, and 15C illustrate various cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
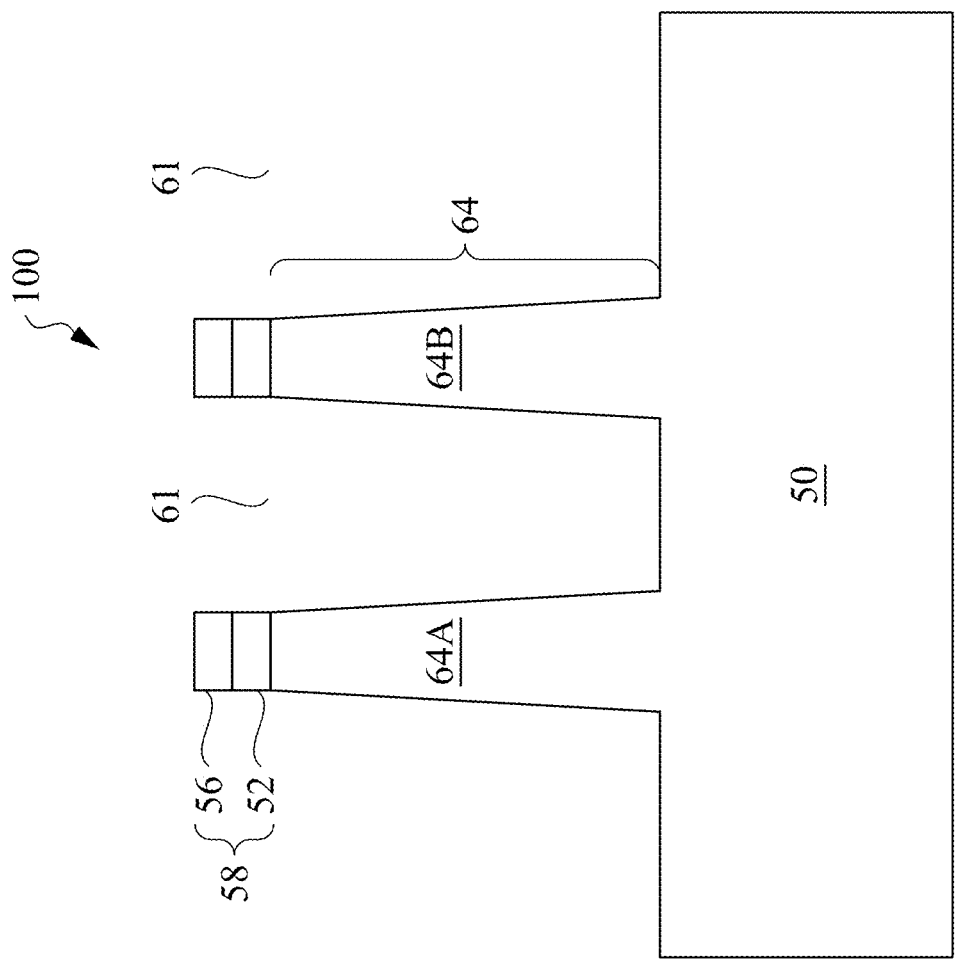

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
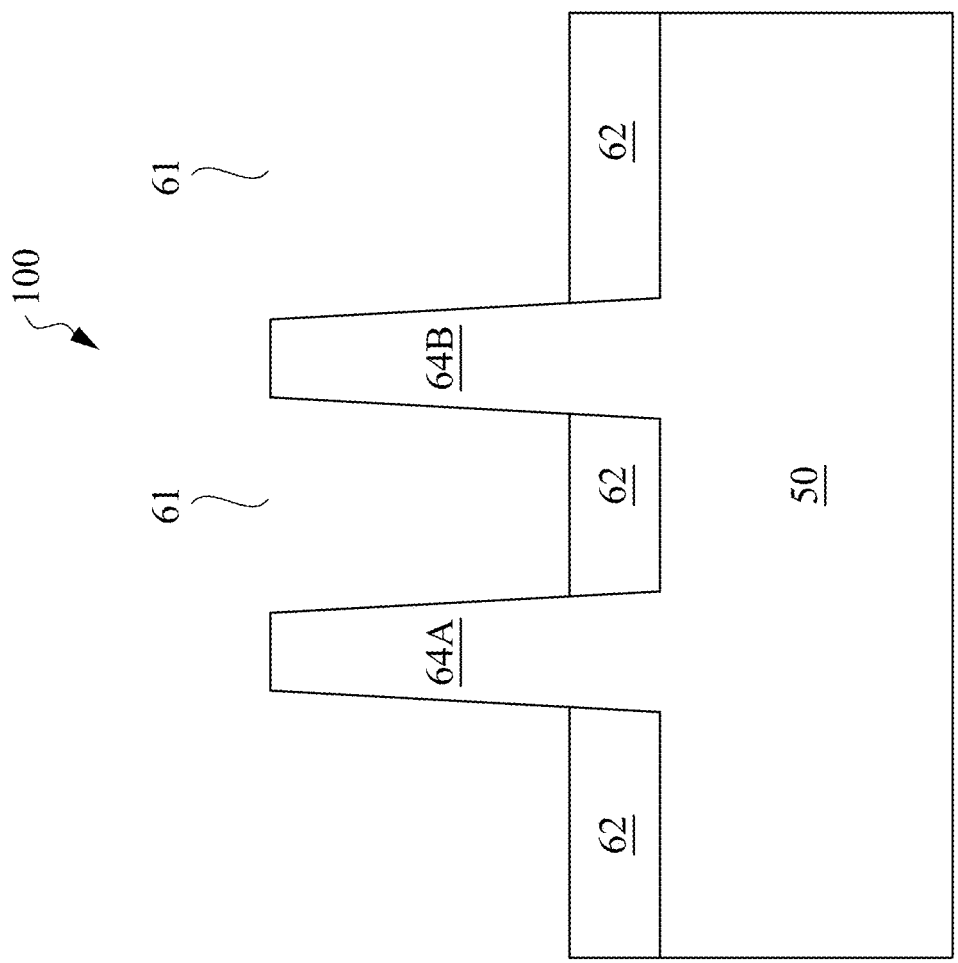

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
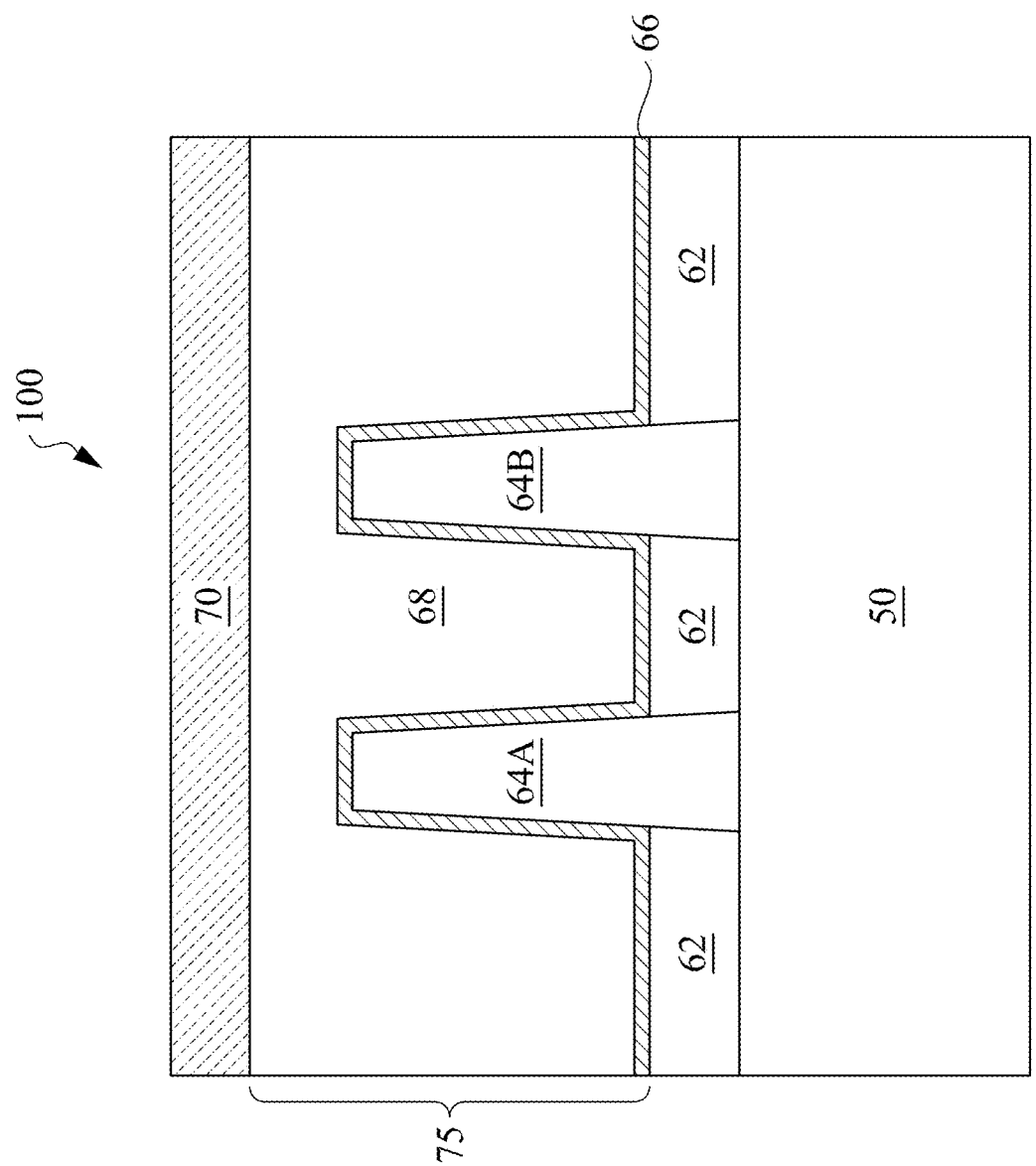

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

Figure 6A:
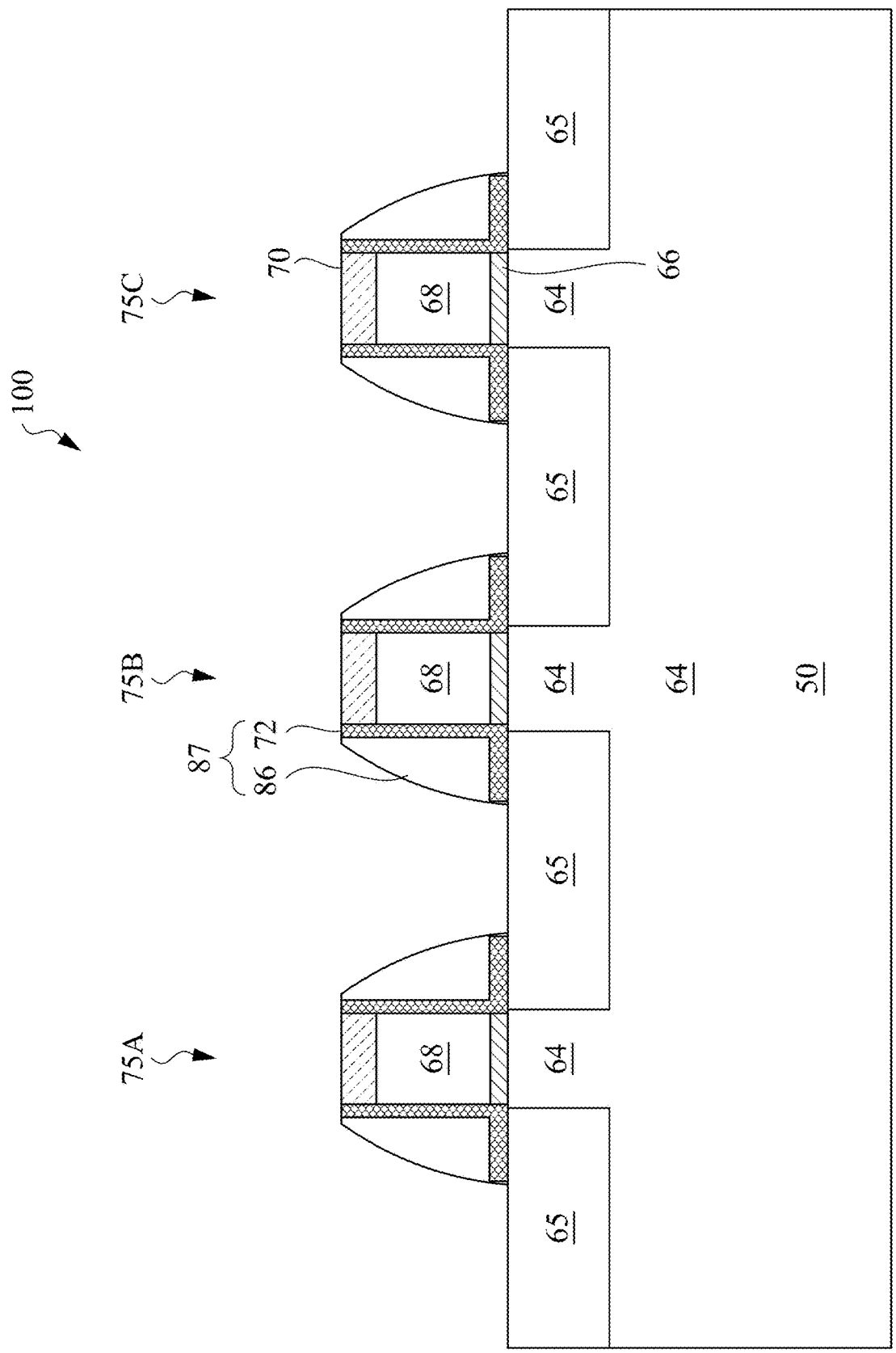

FIG. 6A illustrates the cross-sectional views of further processing of the FinFET device 100 along cross-section A-A (along a longitudinal axis of the fin 64). Note that in FIG. 6A, three dummy gate structures 75 (e.g., 75A, 75B, and 75C) are formed over the fin 64. One skilled in the art will appreciate that more or less than three gate structures may be formed over the fin 64, these and other variations are fully intended to be included within the scope of the present disclosure.

As illustrated in FIG. 6A, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 6A illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted. For simplicity, the LDD regions 65 are not illustrated in subsequent figures, with the understanding the LDD regions 65 may be formed in the fin 64.

Still referring to FIG. 6A, after the LDD regions 65 are formed, gate spacers 87 are formed around the dummy gate structures 75. The gate spacer 87 may include a first gate spacer 72 and a second gate spacer 86. For example, the first gate spacer 72 may be a gate seal spacer and is formed on opposing sidewalls of the gate electrode 68 and on opposing sidewalls of the gate dielectric 66. The second gate spacer 86 is formed on the first gate spacer 72. The first gate spacer 72 may be formed of a nitride, such as silicon nitride, silicon oxynitride, silicon carbonitride, the like, or a combination thereof, and may be formed using, e.g., a thermal oxidation, CVD, or other suitable deposition process. The second gate spacer 86 may be formed of silicon nitride, silicon carbonitride, a combination thereof, or the like using a suitable deposition method.

In an embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove horizontal portions of the first and the second gate spacer layers (e.g., portions along the upper surface of the mask 70 and along the upper surface of the fin 64). The vertical portions of the first and the second gate spacer layers remaining after the anisotropic etch process form the first gate spacer 72 and the second gate spacer 86, respectively.

Figure 6B:
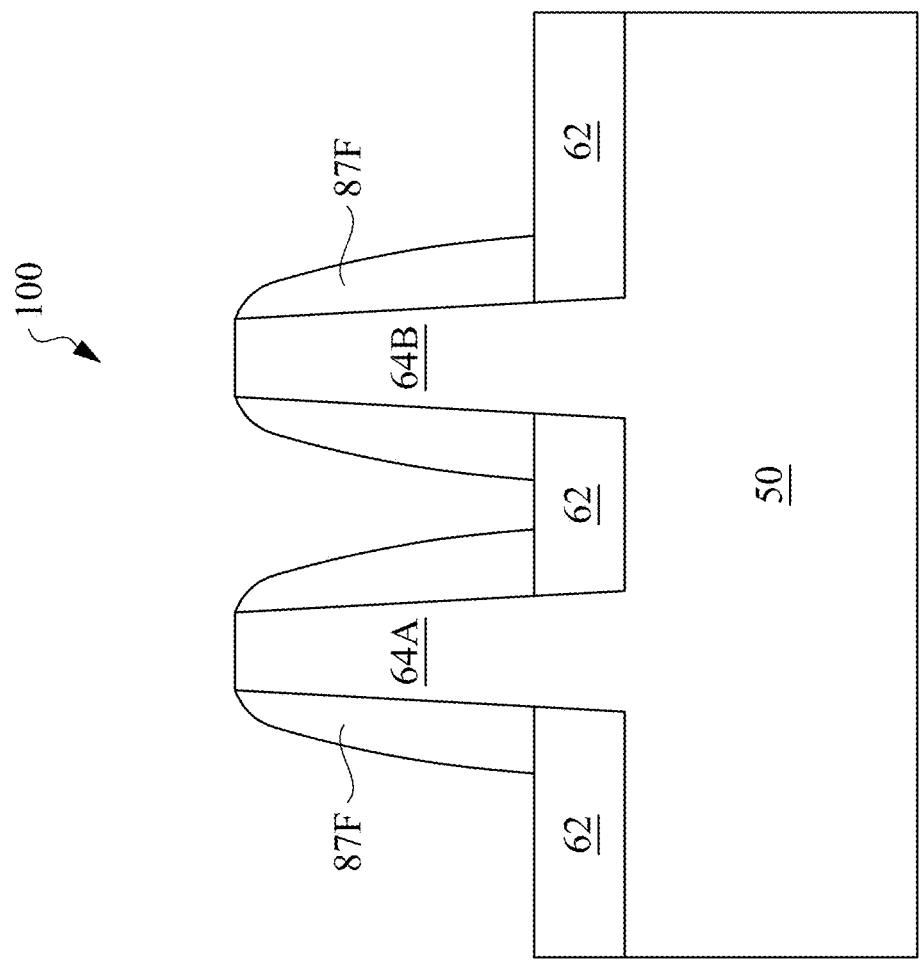

FIG. 6B illustrates the FinFET device 100 along cross-section C-C. As illustrated in FIG. 6B, after the anisotropic etching process, remaining portions of the first and the second gate spacer layers extend along sidewalls of the fins 64, which remaining portions are referred to as fin spacers 87F.

The shapes and formation methods of the gate spacer 87 and the fin spacers 87F as illustrated in FIGS. 6A and 6B are merely non-limiting examples, and other shapes and formation methods are possible. These and other variations are fully intended to be included within the scope of the present disclosure.

Figure 7A:
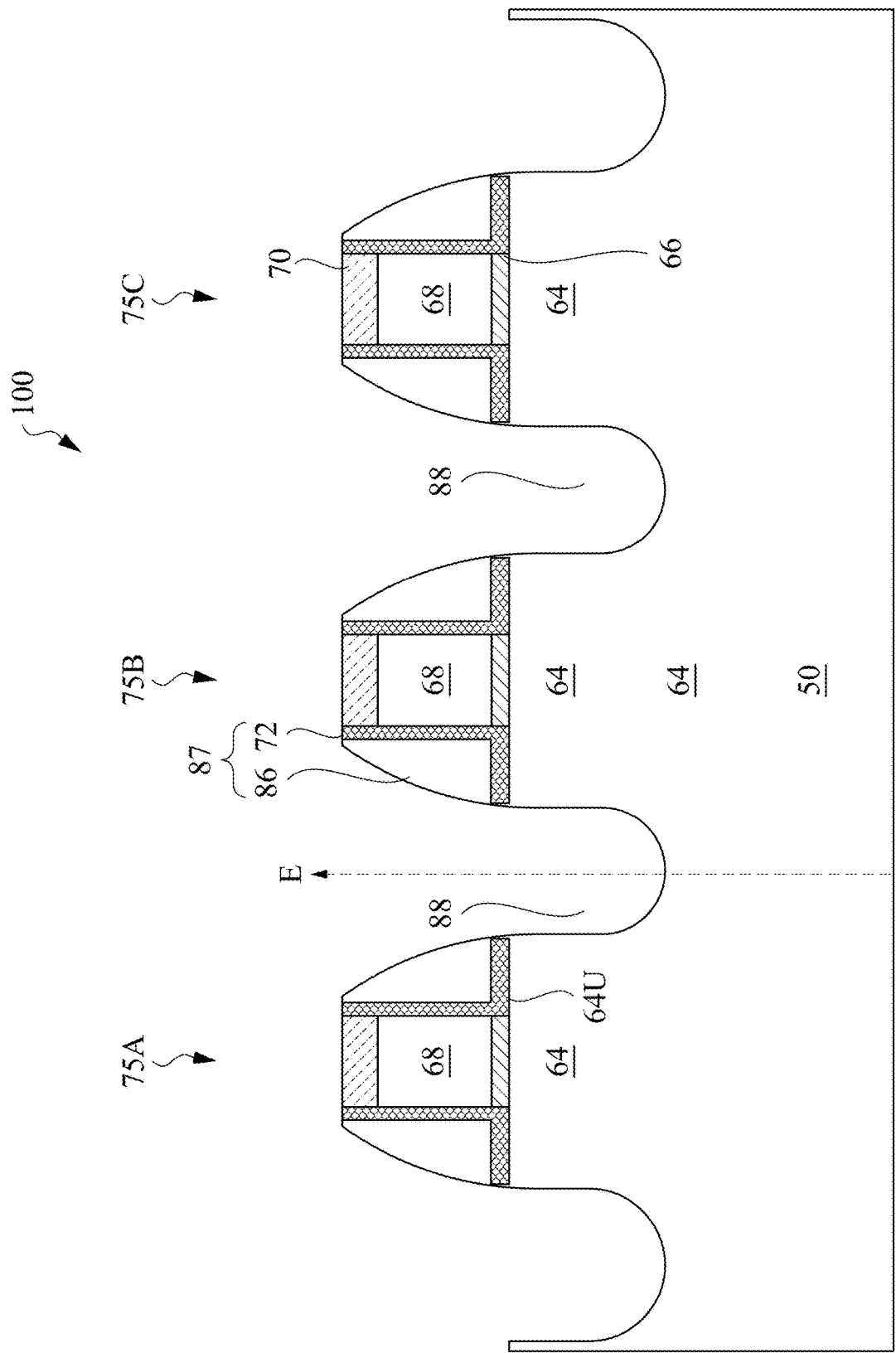

Next, as illustrated in FIG. 7A, recesses 88 are formed in the fins 64 adjacent to the dummy gate structures 75, e.g., between adjacent dummy gate structures 75 and/or next to a dummy gate structure 75. The recesses 88 are formed by, e.g., an anisotropic etching process using the dummy gate structures 75 and the gate spacers 87 as an etching mask, in some embodiments, although any other suitable etching process may also be used.

Figure 7B:
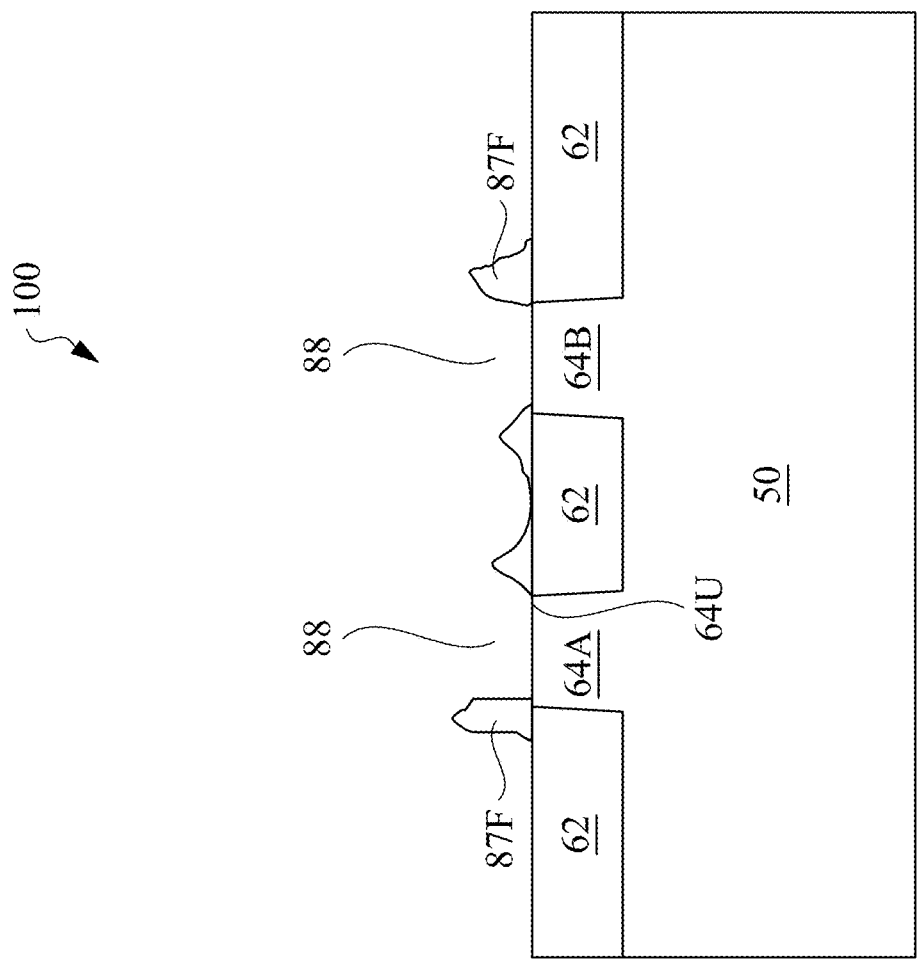

FIG. 7B illustrates the cross-sectional view of the FinFET device 100 along cross-section E-E in FIG. 7A, which cross-section E-E corresponds to the cross-section C-C in FIG. 1. As illustrated in FIG. 7B, the etching process to form the recesses 88 recesses the upper surfaces 64U of the fins 64. In the example of FIG. 7B, the upper surface 64U of the recessed portion of the fin 64 is level with the upper surface of the STI region 62. In some embodiments, the upper surface 64U of the recessed portion of the fin 64 is higher (e.g., further from the substrate 50) or lower (e.g., closer to the substrate 50) than the upper surface of the STI regions 62. Additionally, in the illustrated embodiment, the etching process also recesses the fin spacers 87F. For example, the fin spacers 87F on opposing sides of the recesses 88 are exposed to the etching process, and therefore, are etched away by the etching process. Remaining portions of the fin spacers 87F may have irregular shapes, and the height of the remaining portions of the fin spacers 87F may be a fraction of the height of the fin spacers 87F in FIG. 6B.

Figure 8:
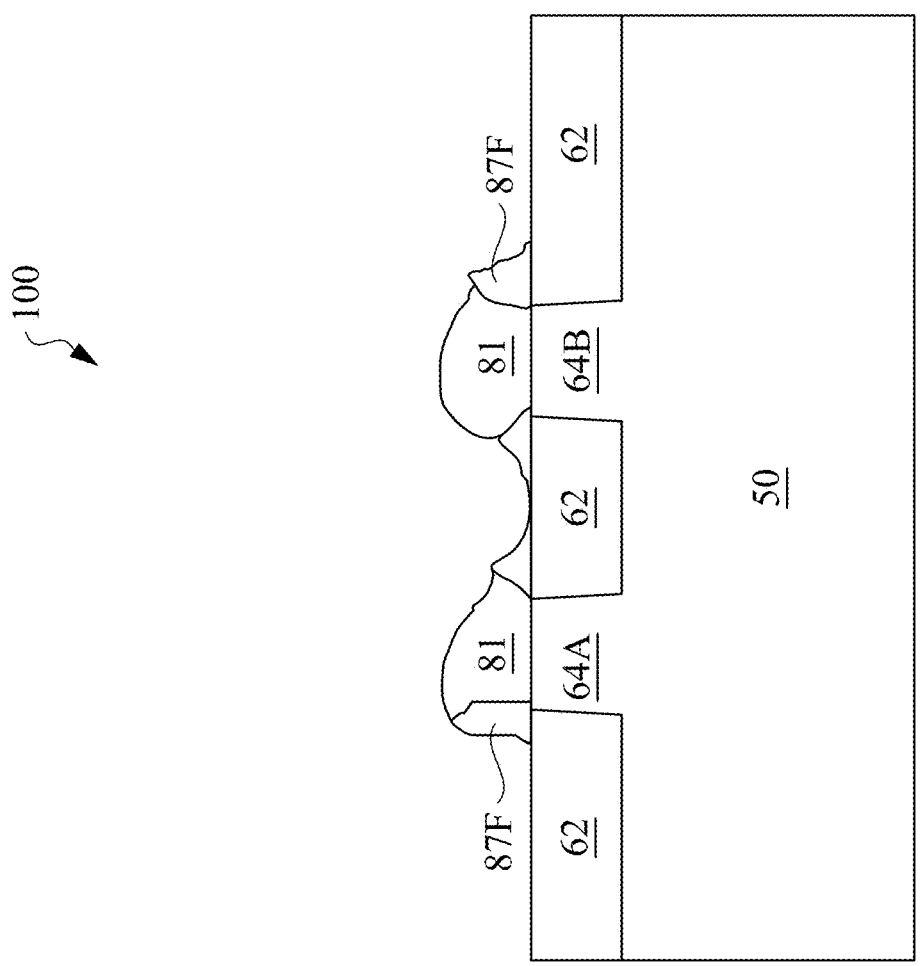

Next, in FIG. 8, a barrier layer 81 is formed in the recesses 88 on the (recessed) fins 64. The barrier layer 81 may be an epitaxial material formed by an epitaxial growth process (also referred to as an epitaxial process) using, e.g., chemical vapor deposition (CVD). The barrier layer 81 is formed to prevent or reduce diffusion of a dopant (e.g., phosphorous) from subsequently formed epitaxial materials 82 and 83 (see, e.g., FIG. 10) into the fins 64 or into the substrate 50.

In some embodiments, the barrier layer 81 and the subsequently formed epitaxial material 82 are formed of different materials. For example, the barrier layer 81 may be formed of silicon arsenic (SiAs), and the subsequently formed epitaxial material 82 may be formed of silicon (Si) doped by phosphorous (P), also referred to as silicon phosphorous (SiP) herein. In some embodiments, a chemical composition of the barrier layer 81 and a chemical composition of the subsequently formed epitaxial material 82 both include the same materials, such as a semiconductor material (e.g., Si) and a dopant (e.g., P), but with different concentrations for the dopant. For example, the barrier layer 81 and the subsequently formed epitaxial material 82 may be both formed of SiP. However, a concentration of the dopant (e.g., P) in the barrier layer 81 is lower (e.g., an order of magnitude lower) than a concentration of the dopant (e.g., P) in the subsequently formed epitaxial material 82. In an example embodiment, the barrier layer 81 is formed of SiP, and the concentration of the dopant (e.g., phosphorous) in the barrier layer 81 is between about $1E19/cm^3$ and about $8E20/cm^3$.

Figure 9:
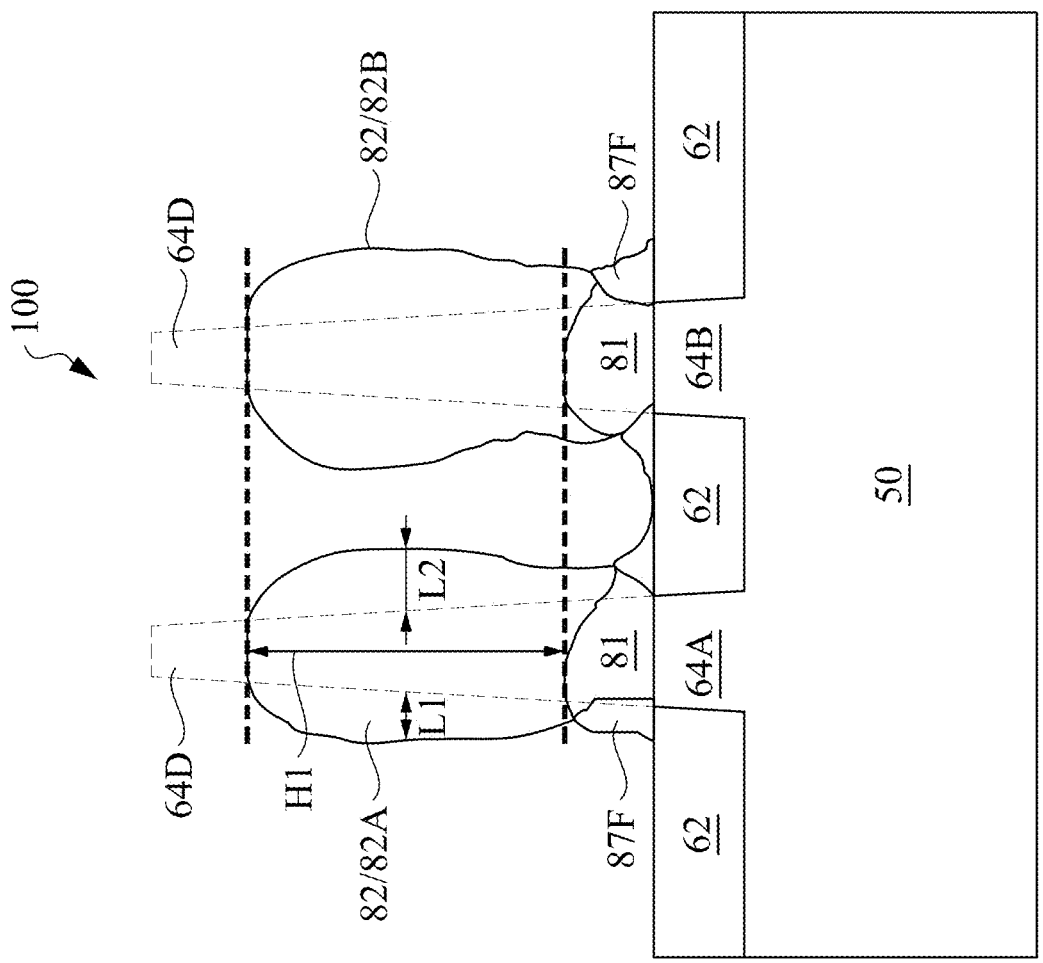

Next, in FIG. 9, the epitaxial material 82 is formed over the barrier layer 81. In some embodiments, the epitaxial material 82 is formed by an epitaxial process, e.g., using CVD. In an example embodiment, the epitaxial material 82 is silicon phosphorous (SiP) (e.g., silicon doped by phosphorous), and the epitaxial process to form the epitaxial material 82 is performed using a process gas comprising a first precursor, a second precursor, and an etching gas. In some embodiments, the first precursor is a silicon-containing precursor (e.g., $SiH_2CO_2$), the second precursor is a phosphorous-containing precursor (e.g., $PH_4$), and the etching gas (e.g., HCl) is selective to (e.g., having a higher etch rate for) the material of the epitaxial material 82. The silicon-containing precursor reacts with the phosphorous-containing precursor to form silicon phosphorous, and the etching gas (e.g., HCl) is added in the process gas to achieve selective growth of the epitaxial material 82 on the fins 64. In the illustrated embodiment, the growth rate of the epitaxial material 82 on the fins 64 is higher than that on other structures of the FinFET device 100, such as the fin spacers 87F, the gate spacers 87, and the STI regions 62. In some embodiments, the etching gas can be adjusted (e.g., by adjusting its flow rate) such that the etch rate of the epitaxial material 82 is lower than the growth rate (also referred to as the deposition rate) of the epitaxial material 82 on the fins 64 but higher than the growth rate of the epitaxial material 82 on the other structures of the FinFET device. As a result, after the epitaxial process is finished, epitaxial material 82 is formed on the fins 64, but not formed on the other structures (e.g., gate spacers 87, the fin spacers 87F, and the STI regions 62) of the FinFET device 100.

In FIG. 9, the dashed lines 64D outline the removed portions of the fins 64. Note that other portions of the fins 64 (e.g., portions directly under the gate structures 75 or directly under the gate spacers 87, which are not in the cross-section of FIG. 9) are not recessed, and therefore, the dashed lines 64D also show the locations of the sidewalls and the upper surfaces of the other portions of the fins 64. Compared with the original shapes and dimensions of the fin spacers 87F in FIG. 6B, the remaining portions of the fin spacers 87F (also referred to as recessed fin spacers 87F) in FIG. 9 have irregular shapes and greatly reduced heights. With little or no constraint from the recessed fin spacers 87F, if an epitaxial process without the presently disclosed method is performed to form the epitaxial material 82, horizontal growth (e.g., growth along the horizontal direction of FIG. 9) of the epitaxial material 82 may happen early in the epitaxial process and may cause the epitaxial material 82 on the fins 64 to merge together, thus preventing a tall air gap (see, e.g., 74 in FIG. 10) from being formed. The presently disclosed method allows for control of the horizontal growth rate and the vertical growth rate of the epitaxial material 82, thus allowing for a bottom-up growth pattern to control the shape of the epitaxial material 82 formed. As a result, an air gap 74 (see FIG. 10) is formed between portions of a subsequently formed epitaxial material 83. The air gap 74 advantageously reduces the gate-to-drain capacitance, thereby improving the alternative current (AC) performance of the device formed. Details are discussed hereinafter.

In an example embodiment, the epitaxial process to form the epitaxial material 82 is performed using a process gas comprising $SiH_2CO_2$, $PH_4$, and HCl. A flow rate of $SiH_2CO_2$ is between about 500 standard cubic centimeters per minute (sccm) and about 1000 sccm, a flow rate of $PH_4$ is between about 200 sccm and about 500 sccm, and a flow rate of HCl is between about 30 sccm and about 100 sccm, in some embodiments. A pressure of the epitaxial process may be between about 150 Torr and about 300 Torr, and a temperature of the epitaxial process may be between about 620° C. and about 700° C., as an example.

In some embodiments, a ratio between the vertical growth rate and the horizontal growth rate of the epitaxial material 82 is adjusted by adjusting a ratio between the flow rate of the silicon-containing precursor (e.g., $SiH_2CO_2$) and the flow rate of the etching gas (e.g., HCl). For example, increasing the ratio between the flow rate of the silicon-containing precursor and the flow rate of the etching gas increases the ratio between the vertical growth rate and the horizontal growth rate of the epitaxial material 82; and vice versa. In some embodiments, the ratio between the vertical growth rate and the horizontal growth rate of the epitaxial material 82 is tuned to be between about 2 and about 3. In other words, the epitaxial process is tuned to grow the epitaxial material 82 faster along the vertical direction than the horizontal direction, such that the growth on each fin 64 has a bottom-up growth pattern to form a slim, vertically extending portion (e.g., having a vertical longitudinal axis) of the epitaxial material 82. The increased distance between the slim, vertically extending portions of the epitaxial material 82 allows for the air gap 74 in FIG. 10 to be formed. Another advantage of the presently disclosed method is that the growth of the epitaxial material 82 is less sensitive to the shapes or dimensions of the remaining portions of the fin spacers 87F, which allows for better control of the shape and/or dimension of the epitaxial material 82 formed, which in turn improves the production yield.

As illustrated in FIG. 9, after the epitaxial process is finished, a first portion 82A of the epitaxial material 82 is formed over the fin 64A on the barrier layer 81, and a second portion 82B of the epitaxial material 82 is formed over the fin 64B on the barrier layer 81. The first portion 82A and the second portion 82B of the epitaxial material 82 are discrete portions of the epitaxial material 82. In other words, the first portion 82A of the epitaxial material 82 is spaced apart from the second portion 82B of the epitaxial material 82.

In some embodiments, a first thickness L1 of the epitaxial material 82, measured between an exterior sidewall of the fin 64 (see the dashed lines 64D) and a respective sidewall of the epitaxial material 82, is between about 8 nm and about 12 nm. A second thickness L2 of the epitaxial material 82, measured between an interior sidewall of the fin 64 (see the dashed lines 64D) and a respective sidewall of the epitaxial material 82, is between about 6 nm and about 10 nm, in some embodiments. The first thickness L1 may be larger than the second thickness L2, due to, e.g., the small space between the fins 64 causing slower growth rate of the epitaxial material 82. A height H1 of the epitaxial material 82, measured between an upper surface (e.g., an uppermost surface) of the barrier layer 81 and an upper surface (e.g., an uppermost surface) of a respective discrete portion (e.g., 82A or 82B) of the epitaxial material 82, may be between about 30 nm and about 40 nm.

In embodiments where a chemical composition of the barrier layer 81 and a chemical composition of the epitaxial material 82 both include a semiconductor material (e.g., Si) and a dopant (e.g., P), the concentration of the dopant (e.g., P) in the epitaxial material 82 is higher than the concentration of the dopant in the barrier layer 81. The concentration of the dopant (e.g., P) in the epitaxial material 82 may be an order of magnitude (e.g., 10 times) or higher than the concentration of the dopant in the barrier layer 81. In an example embodiment, both the barrier layer 81 and the epitaxial material 82 comprise SiP, but the concentration of the dopant (e.g., P) in the epitaxial material 82 (e.g., SiP) is between about $1E21/cm^3$ and about $3E21/cm^3$, which is higher than the concentration of the dopant in the barrier layer, which is between about $1E19/cm^3$ and about $8E20/cm^3$ as described above.

Figure 10:
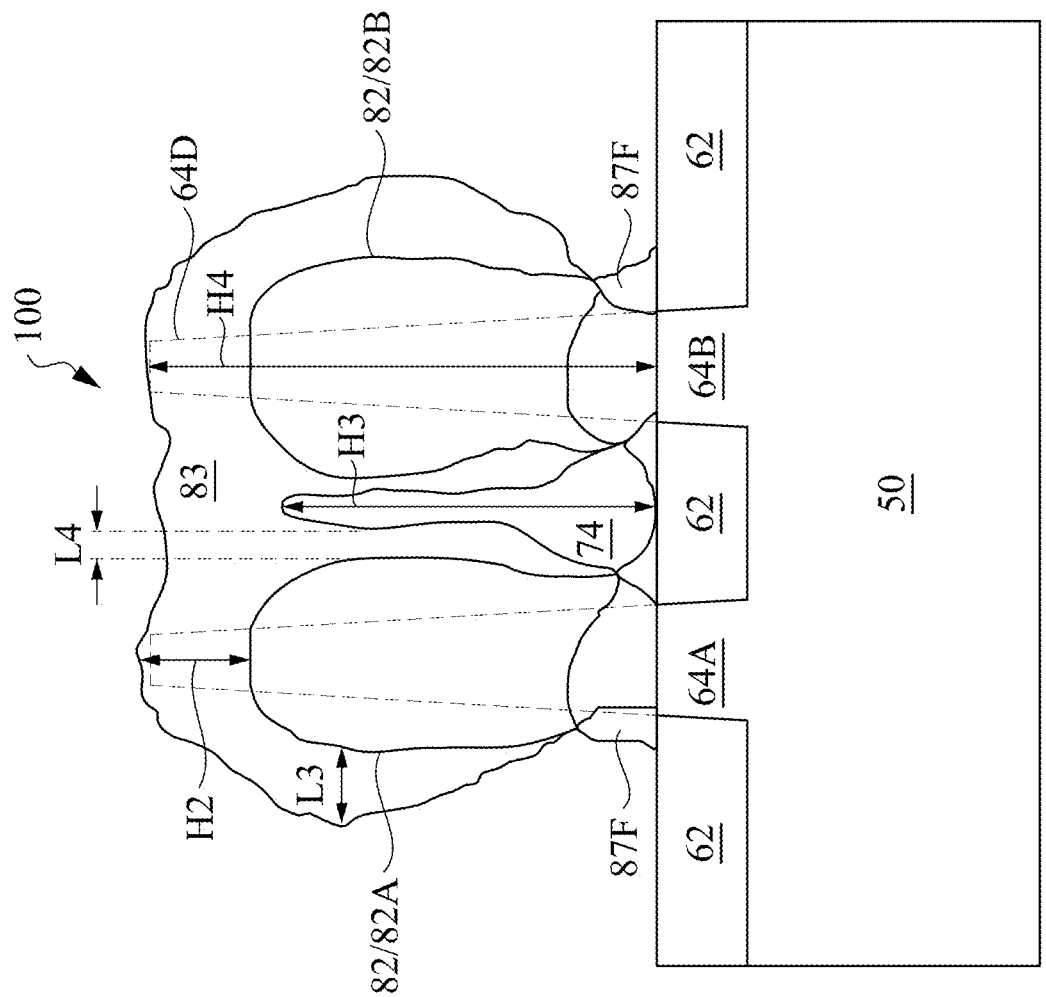

Next, in FIG. 10, the epitaxial material 83 is formed over the epitaxial material 82. In the illustrated embodiment, the epitaxial material 83 is formed of a same material (e.g., SiP) as the epitaxial material 82, but the concentration of the dopant (e.g., P) in the epitaxial material 83 is higher (e.g., three time to four times higher) than the concentration of the dopant (e.g., P) in the epitaxial material 82. In an example embodiment, the concentration of the dopant (e.g., P) in the epitaxial material 83 (e.g., SiP) is between about $3E21/cm^3$ and about $5E21/cm^3$. Since the subsequently formed source/drain contacts are formed to be in contact with the epitaxial material 83, and since higher dopant concentration may improve electrical conductivity, the disclosed method and structure herein improves the direct current (DC) performance of the device formed by, e.g., reducing the electrical resistance of the subsequently formed source/drain contacts.

The epitaxial material 83 is formed by an epitaxial process different from the epitaxial process for forming the epitaxial material 82. Recall that in the epitaxial process for forming the epitaxial material 82, the vertical growth rate is tuned to be higher than the horizontal growth rate, such that a slim, vertical extending portion (e.g., 82A or 82B) of the epitaxial material 82 is formed on each of the fins 64. In the epitaxial process for forming the epitaxial material 83, the horizontal growth rate and the vertical growth rate are substantially the same (e.g., a ratio between the vertical growth rate and the horizontal growth rate is between about 0.9 and about 1.2) to achieve a substantially isotropic growth, such that the epitaxial material 83 is formed conformally along sidewalls and upper surfaces of the discrete portions 82A and 82B of the epitaxial material 82. As illustrated in FIG. 10, the epitaxial material 83 extends continuously from the fin 64A to the fin 64B. In other words, the epitaxial material 83 over the first portion 82A and over the second portion 82B of the epitaxial material 82 merged together to form a continuous layer of epitaxial material 83.

In some embodiments, to form the epitaxial material 83, the epitaxial process is performed with a process gas comprising a first precursor, a second precursor, a third precursor, and an etching gas. In an embodiment, the first precursor is a silicon-containing precursor (e.g., $SiH_2CO_2$), the second precursor is a phosphorous-containing precursor (e.g., $PH_4$), the third precursor is a silicon-containing precursor (e.g., $SiH_4$) different from the first precursor, and the etching gas (e.g., HCl) is selective to (e.g., having a higher etch rate for) the material of the epitaxial material 83. Note that compared with the epitaxial process for forming the epitaxial material 82, the epitaxial process for forming the epitaxial material 83 uses an additional silicon-containing precursor (e.g., $SiH_4$). The epitaxial material 83 formed due to the additional silicon-containing precursor (e.g., $SiH_4$) has a more isotropic growth rate (e.g., having substantially the same horizontal growth rate and vertical growth rate), thus is conducive to form the epitaxial material 83 conformally over the epitaxial material 82. In addition, the ratio between the flow rate of the first precursor (e.g., $SiH_2CO_2$) and the etching gas (e.g., HCl) may be tuned to promote conformal growth of the epitaxial material 83.

In some embodiments, the epitaxial process to form the epitaxial material 83 is performed using a process gas comprising $SiH_2CO_2$, $PH_4$, $SiH_4$, and HCl. A flow rate of $SiH_2CO_2$ is between about 500 sccm and about 1000 sccm, a flow rate of $PH_4$ is between about 200 sccm and about 500 sccm, a flow rate of $SiH_4$ is between about 10 sccm and about 500 sccm, and a flow rate of HCl is between about 50 sccm and about 200 sccm, in some embodiments. A pressure of the epitaxial process may be between about 150 Torr and about 200 Torr, and a temperature of the epitaxial process may be between about 620° C. and about 700° C., as an example.

As illustrated in FIG. 10, after the epitaxial material 83 is formed, a third thickness L3 of the epitaxial material 83, measured between an exterior sidewall of the fin 64 (see the dashed lines 64D) and a respective sidewall of the epitaxial material 83, is between about 8 nm and about 15 nm. A fourth thickness L4 of the epitaxial material 83, measured between an interior sidewall of the fin 64 (see the dashed lines 64D) and a respective sidewall of the epitaxial material 83, is between about 4 nm and about 8 nm, in some embodiments. A height H2 of the epitaxial material 83, measured between an upper surface (e.g., an uppermost surface) of the epitaxial material 82 and an upper surface (e.g., an uppermost surface) of the epitaxial material 83, may be between about 10 nm and about 20 nm.

Notably, in FIG. 10, an air gap 74 is formed between the fins 64. Specifically, the air gap 74 is formed between a first portion of the epitaxial material 83 and a second portion of the epitaxial material 83, where the first portion of the epitaxial material 83 extends along a sidewall of the first portion 82A of the epitaxial material 82 facing the second portion 82B of the epitaxial material 82, where the second portion of the epitaxial material 83 extends along a sidewall of the second portion 82B of the epitaxial material 82 facing the first portion 82A of the epitaxial material 82. A height H3 of the air gap 74 is more than 30 nm, such as between about 30 nm and about 35 nm, which may not be achievable without the disclosed method. In some embodiments, the height H3 of the air gap 74 is between about 60% and about 80% of the fin height H4, where the fin height H4 is the distance between the upper surface of the STI regions 62 and the upper surface of the fin 64. The large height H3 of the air gap 74 reduces the gate-to-drain capacitance, thereby improving the alternative current (AC) performance of the device formed.

Figure 11A:
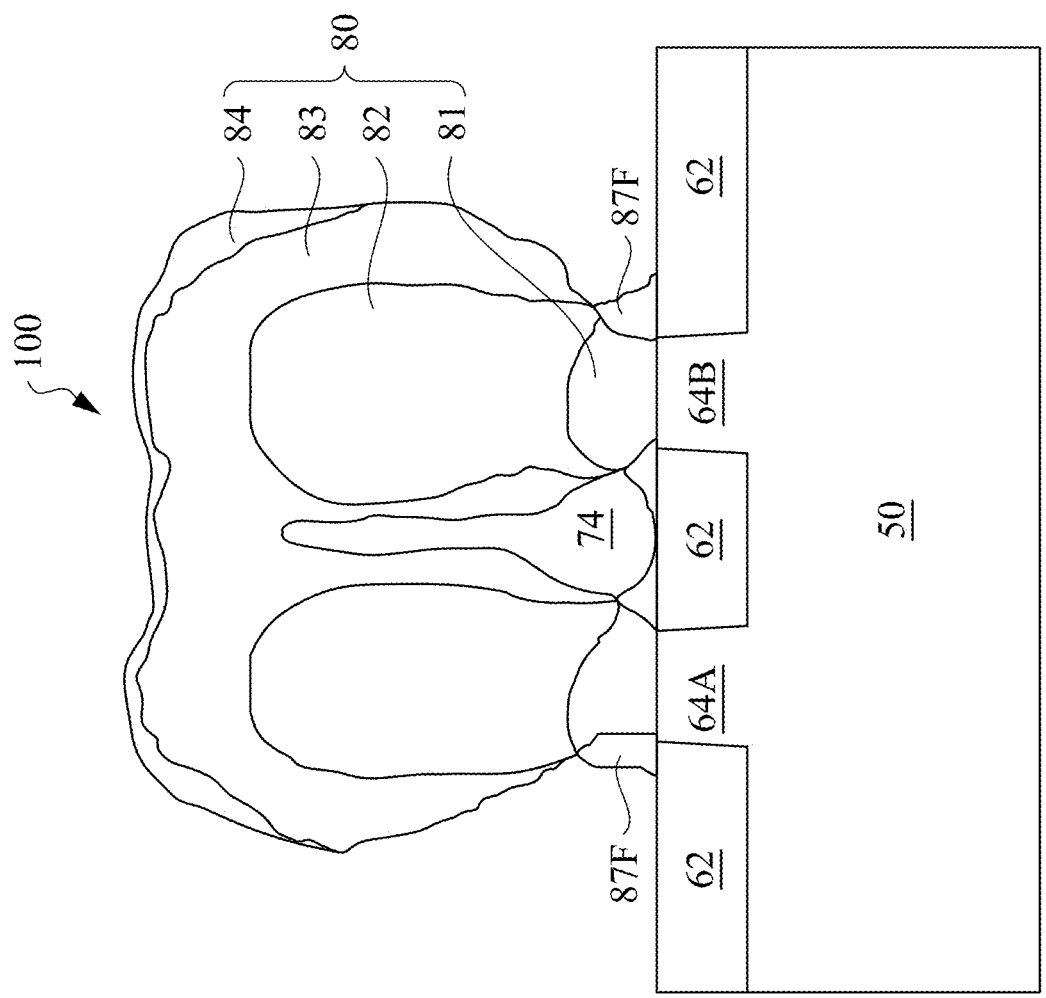

Next, in FIG. 11A, a capping layer 84 is formed over the epitaxial material 83. The capping layer 84 protects the underlying epitaxial material 83 from, e.g., subsequent etching processes. In the illustrated embodiment, the capping layer 84 is formed of a same material (e.g., SiP) as the epitaxial material 82, but the concentration of the dopant (e.g., P) in the capping layer 84 is lower (e.g., an order of magnitude lower) than the concentration of the dopant (e.g., P) in the epitaxial material 82. In an example embodiment, the concentration of the dopant (e.g., P) in the capping layer 84 (e.g., SiP) is between about 1E20/cm$^3$ and about 8E20/cm$^3$.

In some embodiments, the capping layer 84 is formed by an epitaxial process, e.g., using CVD. In an example embodiment, the capping layer 84 is silicon phosphorous (SiP) (e.g., silicon doped by phosphorous), and the epitaxial process to form the capping layer 84 is performed using a process gas comprising a first precursor, a second precursor, and an etching gas. In an embodiment, the first precursor is a silicon-containing precursor (e.g., SiH$_2$CO$_2$), the second precursor is a phosphorous-containing precursor (e.g., PH$_4$), and the etching gas (e.g., HCl) is selective to (e.g., having a higher etch rate for) the material of the epitaxial material 82.

In some embodiments, the epitaxial process to form the capping layer 84 is performed using a process gas comprising SiH$_2$CO$_2$, PH$_4$, and HCl. A flow rate of SiH$_2$CO$_2$ is between about 500 sccm and about 1000 sccm, a flow rate of PH$_4$ is between about 200 sccm and about 500 sccm, and a flow rate of HCl is between about 100 sccm and about 500 sccm, in some embodiments. A pressure of the epitaxial process may be between about 100 Torr and about 300 Torr, and a temperature of the epitaxial process may be between about 620° C. and about 700° C., as an example. After the capping layer 84 is formed, a thickness of the capping layer 84 may be between about 1 nm and about 3 nm. For simplicity, the barrier layer 81, the epitaxial materials 82 and 83, and the capping layer 84 in FIG. 11A may be collectively referred to as a source/drain region 80, and the sub-layers (e.g., 81, 82, 83, and 84) of the source/drain region 80 may not be illustrated in subsequent figures.

Figure 11B:
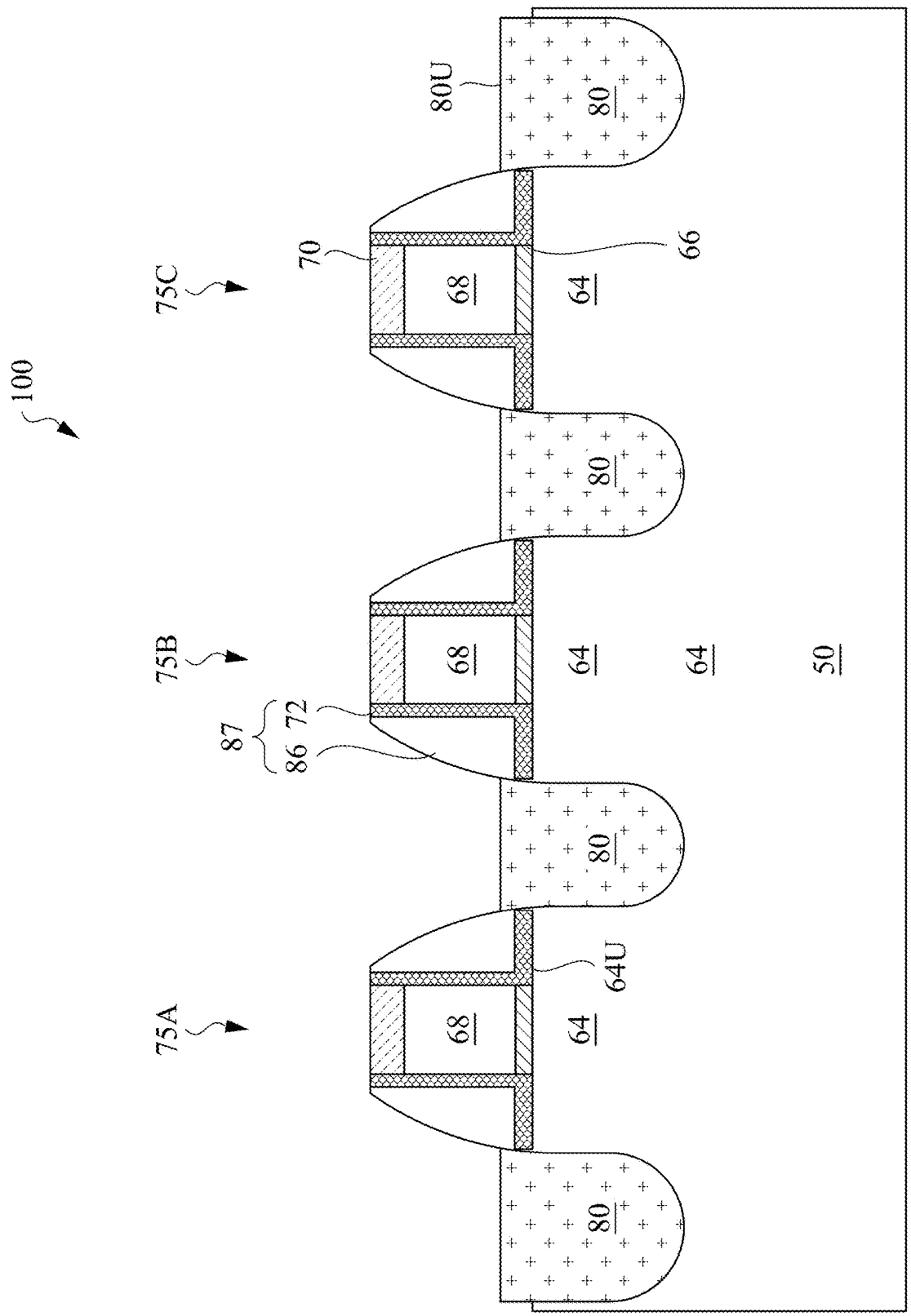

FIG. 11B illustrates the FinFET device 100 of FIG. 11A, but along cross-section A-A of FIG. 1. As illustrated in FIG. 11B, the epitaxial source/drain regions 80 may have surfaces raised from respective surfaces of the fins 64 (e.g. raised above the non-recessed upper surface 64U of the fins 64) and may have facets. In some embodiments, the resulting FinFET is an n-type FinFET, and the source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

Figure 12:
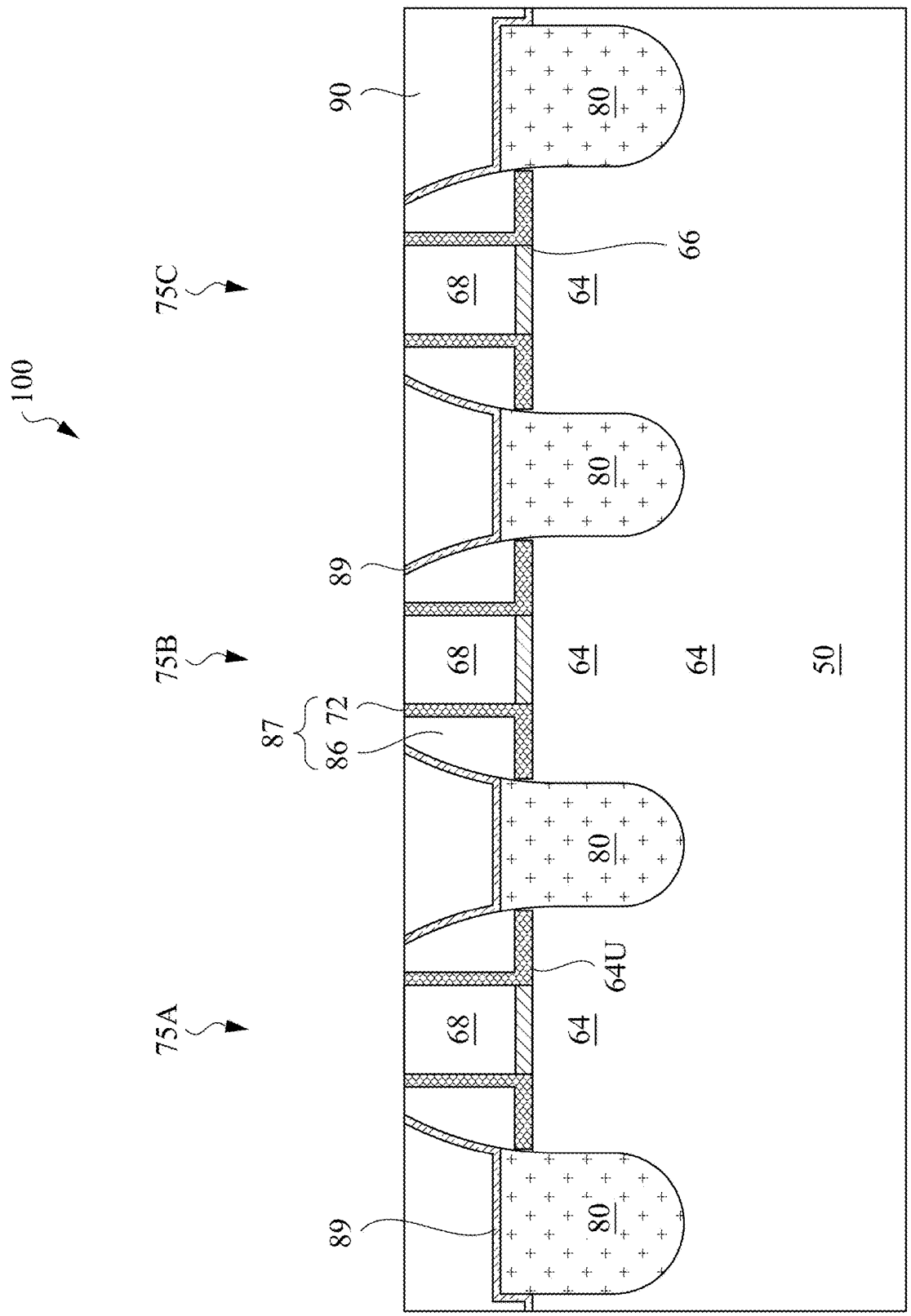

Next, as illustrated in FIG. 12, a contact etch stop layer (CESL) 89 is formed over the structure illustrated in FIG. 11A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate electrode 68. After the planarization process, the top surface of the first ILD 90 is level with the top surface of the gate electrode 68.

Figure 13:
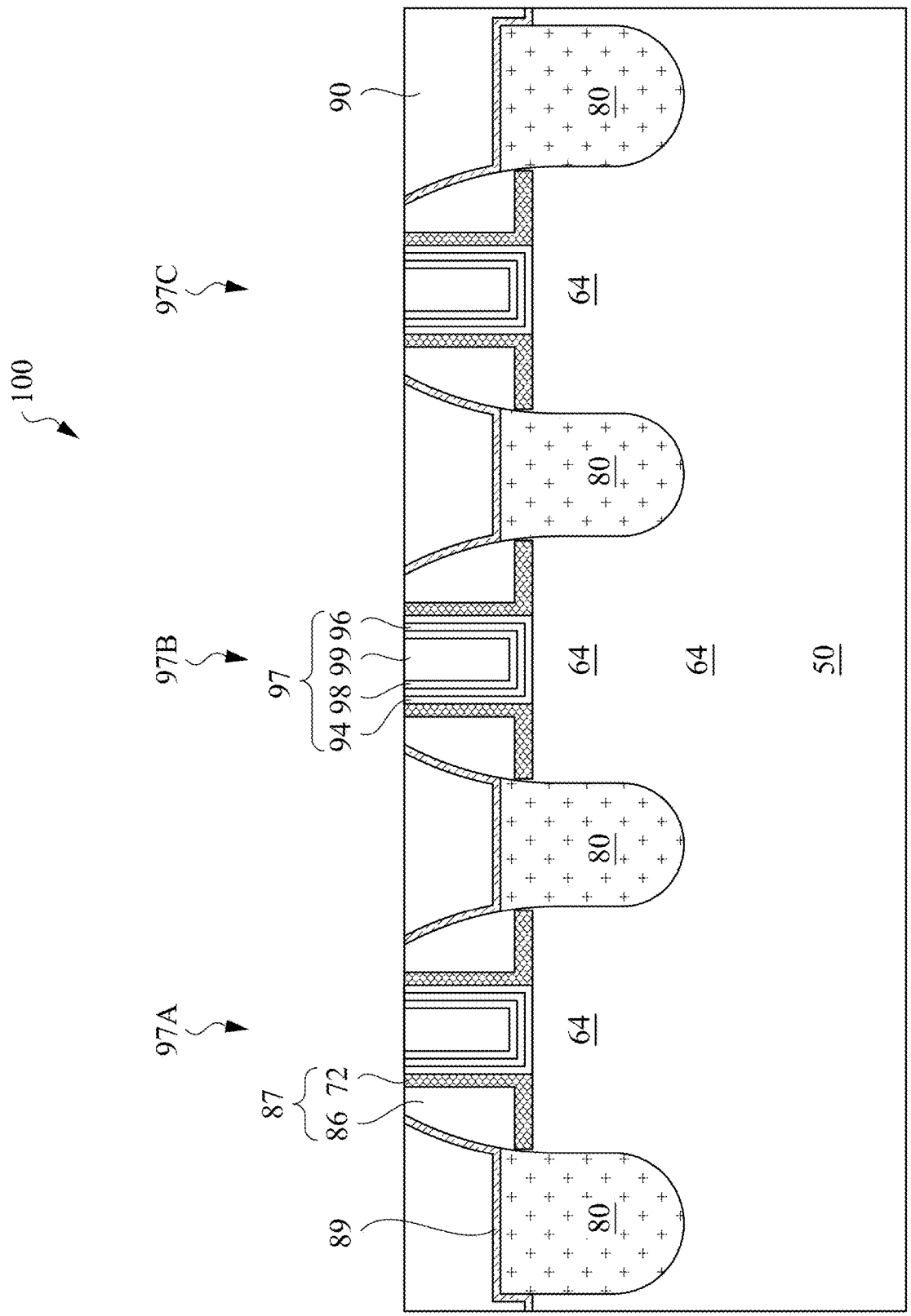

Next, in FIG. 13, a gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 13, the dummy gate structures 75A, 75B, and 75C (see FIG. 12) are replaced by replacement gate structures 97A, 97B, and 97C, respectively. In accordance with some embodiments, to form the replacement gate structures 97 (e.g., 97A, 97B, or 97C), the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 99 are formed in the recesses for the replacement gate structure 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In some embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may also be utilized. The barrier layer 96 may be formed using a CVD process, such as PECVD. However, other processes, such as sputtering, metal organic chemical vapor deposition (MOCVD), or ALD, may also be used.

Next, the work function layer 98, such as a P-type work function layer or an N-type work function layer, may be formed in the recesses over the barrier layers 96 and before the gate electrode 99 is formed, in some embodiments. Exemplary P-type work function metals that may be included in the gate structures for P-type devices include TiN, TaN, Ru, Mo, Al, WN, ZrSi2, MoSi2, TaSi2, NiSi2, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 99 is deposited over the seed layer, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the upper surface of the first ILD 90. The resulting remaining portions of the gate dielectric layer 94, the barrier layer 96, the work function layer 98, the seed layer, and the gate electrode 99 thus form the replacement gate structure 97 of the resulting FinFET device 100.

Figure 14:
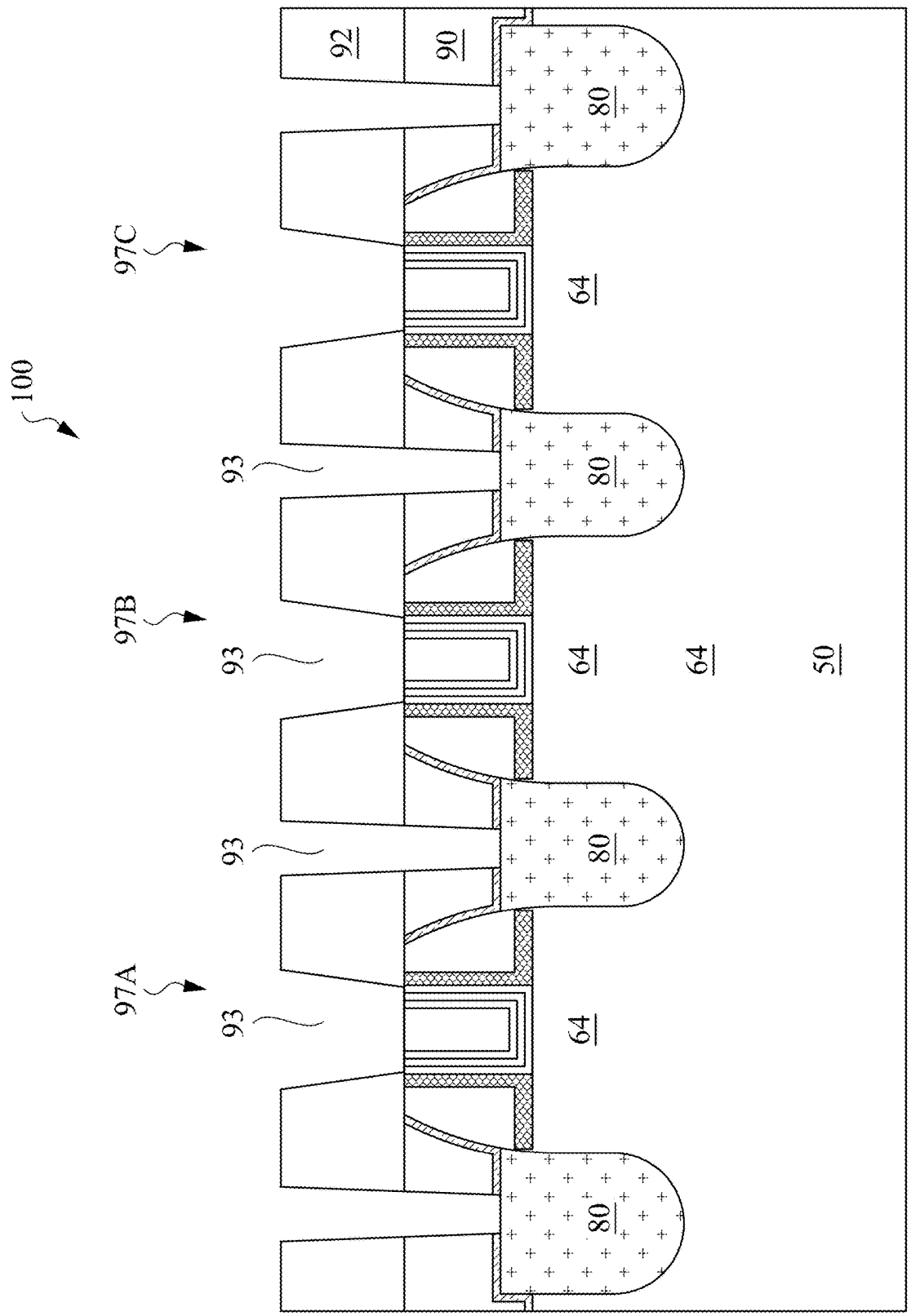

Referring next to FIG. 14, a second ILD 92 is formed over the first ILD 90. Openings 93 are formed through the second ILD 92, or through the second ILD 92 and the first ILD 90, to expose the replacement gate structures 97 or the source/drain regions 80.

In an embodiment, the second ILD 92 is a flowable film formed by a flowable CVD method. In some embodiments, the second ILD 92 is formed of a dielectric material such as silicon oxide, PSG, BSG, BPSG, USG, or the like, and may be deposited by any suitable method, such as CVD and PECVD. In some embodiments, the second ILD 92 and the first ILD 90 are formed of a same material. In some embodiments, the second ILD 92 and the first ILD 90 are formed of different materials.

In some embodiments, the openings 93 in FIG. 14 are formed using photolithography and etching. The etching process etches through the CESL 89 to expose the source/drain regions 80. The etching process is an anisotropic etching process, in some embodiments.

Figure 15A:
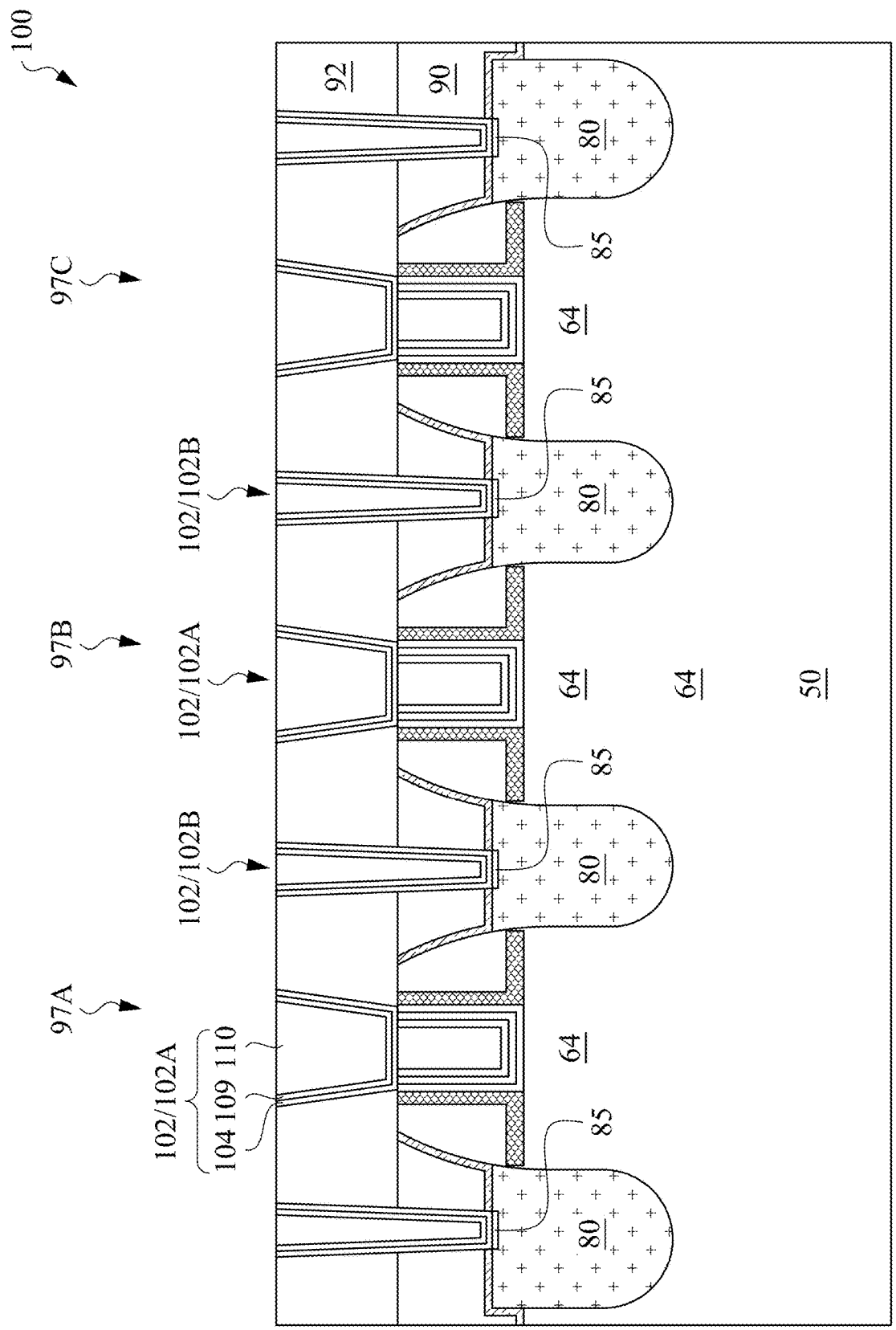

Next, in FIG. 15A, silicide regions 85, which may be optional, are formed in the openings 93 over the source/drain regions 80. In some embodiments, the silicide regions 85 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 80, then performing a thermal anneal process. The unreacted portions of the deposited metal are then removed, e.g., by an etching process. Although regions 85 are referred to as silicide regions, regions 85 may also be germanide regions, or silicon germanide regions (e.g., regions comprising silicide and germanide).

Next, a barrier layer 104 is formed (e.g., conformally) in the openings 93. The barrier layer may comprise an electrically conductive material such as titanium nitride, although other materials, such as tantalum nitride, titanium, tantalum, or the like, may alternatively be utilized. The barrier layer may be formed using ALD, CVD, PECVD, MOCVD, or the like.

Next, a seed layer 109 is formed (e.g., conformally) over the barrier layer 104. The seed layer 109 may include copper, titanium, tantalum, titanium nitride, tantalum nitride, the like, or a combination thereof, and may be deposited by ALD, sputtering, PVD, or the like. In some embodiments, the seed layer 109 is a metal layer, which may be a single layer or a composite layer comprising a plurality of sub-layers formed of different materials. For example, the seed layer 109 may comprise a titanium layer and a copper layer over the titanium layer.

Next, an electrically conductive material 110 is formed in the openings 93 to fill the openings 93. The electrically conductive material 110 may be a metal-containing material such as Cu, Al, W, the like, combinations thereof, or multi-layers thereof, and may be formed by, e.g., electroplating, electroless plating, or other suitable method. A planarization process, such as CMP, may be performed to remove excess portions of the layers (e.g., 104, 109, and 110) that are disposed over the upper surface of the second ILD 92. The remaining portions of the barrier layer 104, the seed layer 109, and the electrically conductive material 110 form contacts 102 (also referred to as contact plugs), such as source/drain contacts 102B and gate contacts 102A.

Figure 15B:
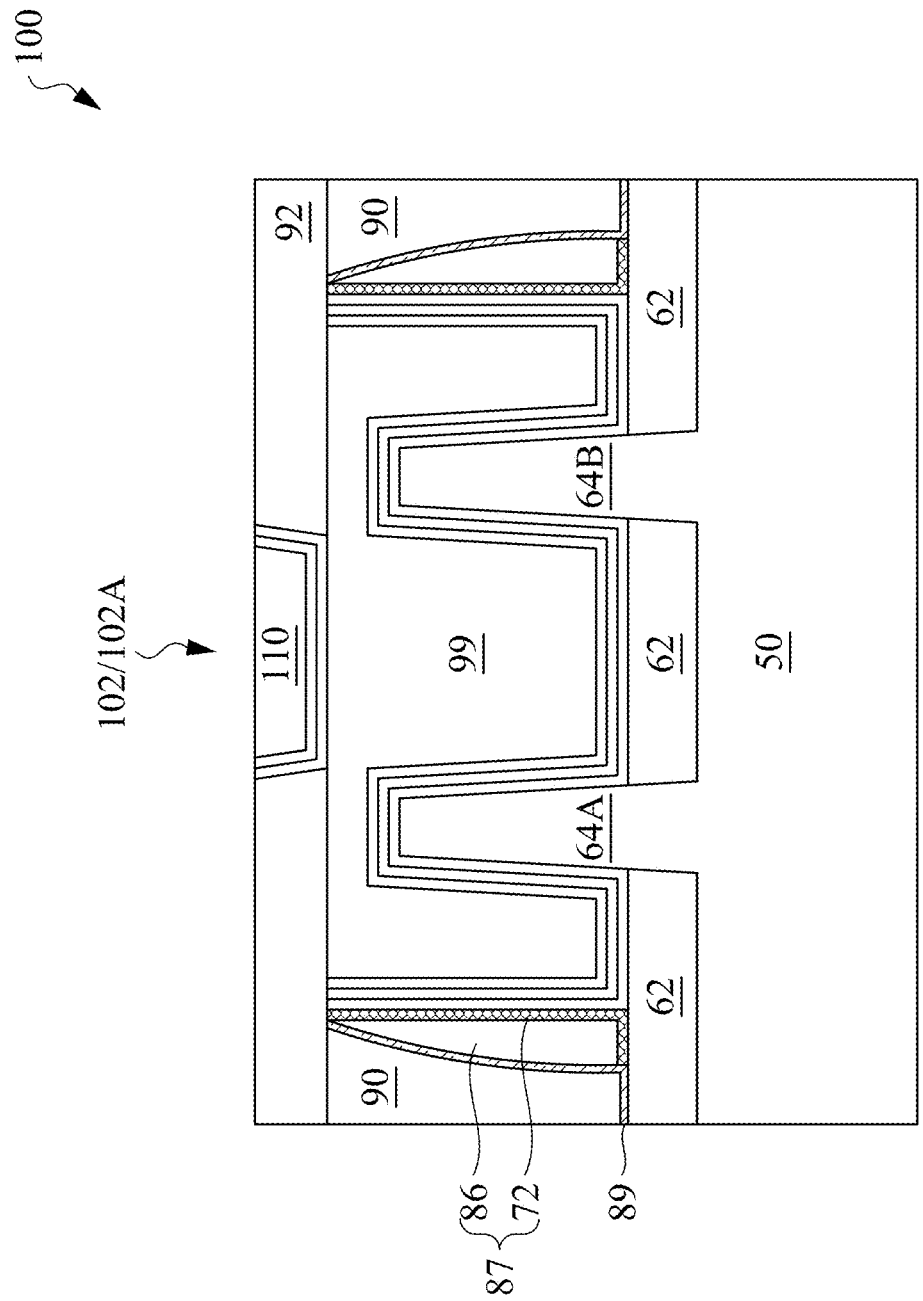
Figure 15C:
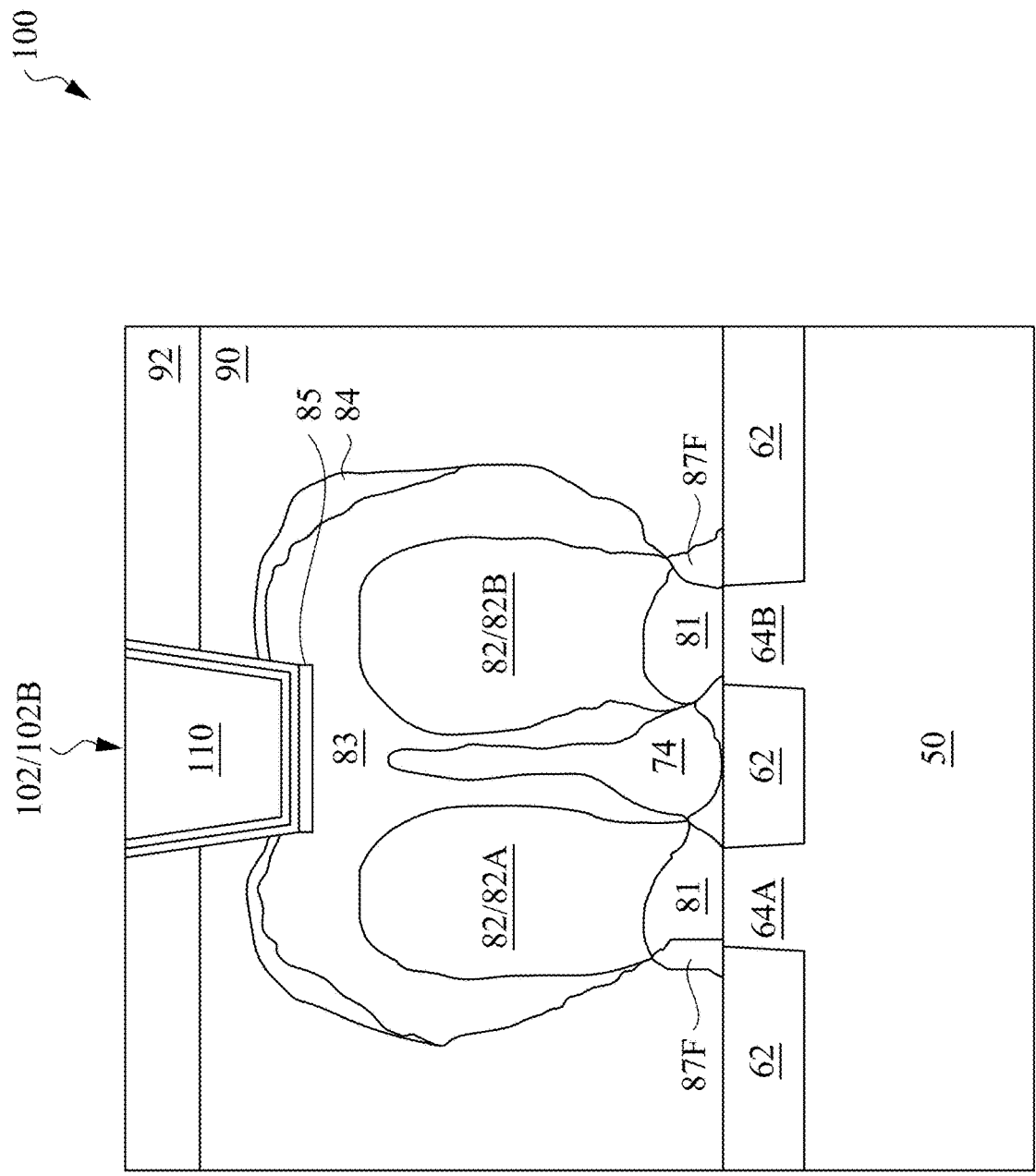

FIGS. 15B and 15C illustrate the FinFET device 100 of FIG. 15A, but along cross-sections B-B and C-C in FIG. 1, respectively. Note that in the example of FIG. 15C, the air gap 74 is sealed to form an enclosed cavity by, e.g., the epitaxial material 83, the STI regions 62, the fin spacers 87F, and the second ILD 92.

Additional processing may follow the processing of FIGS. 15A-15C, as one skilled in the art readily appreciates. For example, an interconnect structure, which includes a plurality of dielectric layers and conductive features (e.g., vias, conductive lines such as metal lines) formed in the plurality of dielectric layers, may be formed over the second ILD 92 to interconnect the underlying electrical components (e.g., transistors) to form function circuits. Details are not discussed here.

Variations to the disclosed embodiments are possible and are fully intended to be included within the scope of the present disclosure. For example, the illustrated embodiment shows two fins 64 in the FinFET device 100 as a non-limiting example. One skilled in the art will readily appreciate that the FinFET device 100 may have more than two fins 64, in which case the disclosed method can be readily applied to form multiple discrete portions of the epitaxial material 82, one over each of the fins 64, and the epitaxial material 83 is then formed over the epitaxial material 82 to connect the multiple discrete portions of the epitaxial material 82 to form a merged source/drain region 80.

Figure 16:
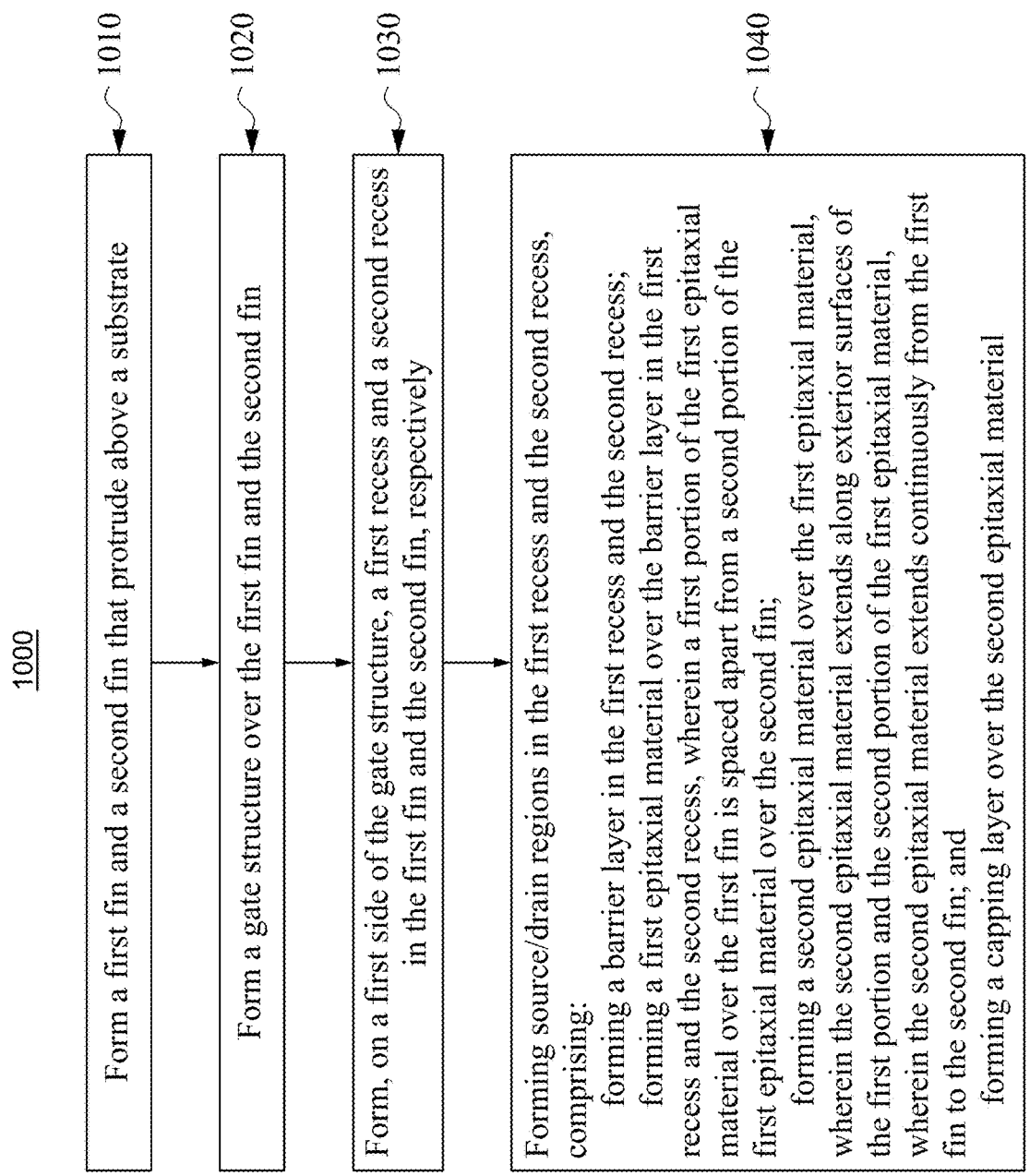
FIG. 16 illustrates a flow chart of method of forming a semiconductor device, in accordance with some embodiments.

FIG. 16 illustrates a flow chart of a method 1000 of forming a FinFET device, in accordance with some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged and repeated.

Referring to FIG. 16, at block 1010, a first fin and a second fin are formed that protrude above a substrate. At block 1020, a gate structure is formed over the first fin and the second fin. At block 1030, a first recess and a second recess are formed in the first fin and the second fin, respectively, on a first side of the gate structure. At block 1040, source/drain regions are formed in the first recess and the second recess, comprising: forming a barrier layer in the first recess and the second recess; forming a first epitaxial material over the barrier layer in the first recess and the second recess, wherein a first portion of the first epitaxial material over the first fin is spaced apart from a second portion of the first epitaxial material over the second fin; forming a second epitaxial material over the first epitaxial material, wherein the second epitaxial material extends along exterior surfaces of the first portion and the second portion of the first epitaxial material, wherein the second epitaxial material extends continuously from the first fin to the second fin; and forming a capping layer over the second epitaxial material.

Embodiments may achieve advantages. For example, the disclosed methods for growing the epitaxial material 82 is not sensitive to the shape or dimension of the remaining portions of the fin spacers 87E, thus allowing better control of the shape of the epitaxial material 82 to boost production yield. The disclosed method provides ways to tune the vertical growth rate and the horizontal growth rate of the epitaxial material 82, thus promoting vertical growth of the epitaxial material 82 to form vertically extending discrete portions (e.g., 82A, 82B). The vertically extending discrete portions allow the air gap 74 to be formed, which reduces the gate-to-drain capacitance, thereby improving the AC performance of the device formed. The epitaxial material 83 is formed to have a high dopant concentration and to merge between the discrete portions of the epitaxial material 82, which reduces the electrical resistance of the source/drain contact plugs, thus improving the DC performance of the device formed.

In accordance with an embodiment, a method of forming a fin field-effect transistor (FinFET) device includes: forming a first fin and a second fin that protrude above a substrate; forming a gate structure over the first fin and the second fin; forming, on a first side of the gate structure, a first recess and a second recess in the first fin and the second fin, respectively; and forming a source/drain region in the first recess and the second recess, comprising: forming a barrier layer in the first recess and the second recess; forming a first epitaxial material over the barrier layer in the first recess and the second recess, wherein a first portion of the first epitaxial material over the first fin is spaced apart from a second portion of the first epitaxial material over the second fin; forming a second epitaxial material over the first epitaxial material, wherein the second epitaxial material extends along exterior surfaces of the first portion and the second portion of the first epitaxial material, wherein the second epitaxial material extends continuously from the first fin to the second fin; and forming a capping layer over the second epitaxial material. In an embodiment, the second epitaxial material has a third portion extending along a first sidewall of the first portion of the first epitaxial material, the first sidewall facing the second portion of the first epitaxial material, and wherein the second epitaxial material has a fourth portion extending along a second sidewall of the second portion of the first epitaxial material, the second sidewall facing the first portion of the first epitaxial material, wherein after forming the second epitaxial material, there is an air gap between the third portion and the fourth portion of the second epitaxial material. In an embodiment, forming the first recess and the second recess comprises performing an etching process to remove a first portion of the first fin and a second portion of the second fin, wherein the etching process recesses first fin spacers disposed along sidewalls of the first fin and recesses second fin spacers disposed along sidewalls of the second fin. In an embodiment, the first epitaxial material extends further from the substrate than the recessed first fin spacers and the recessed second fin spacers. In an embodiment, the capping layer extends continuously along an upper surface of the second epitaxial material from the first fin to the second fin. In an embodiment, each of the first epitaxial material, the second epitaxial material, and the capping layer comprises a semiconductor material and a dopant, wherein a second concentration of the dopant in the second epitaxial material is higher than a first concentration of the dopant in the first epitaxial material, wherein a third concentration of the dopant in the capping layer is lower than the first concentration of the dopant in the first epitaxial material. In an embodiment, the barrier layer comprises the semiconductor material and the dopant, wherein a fourth concentration of the dopant in the barrier layer is lower than the first concentration of the dopant in the first epitaxial material. In an embodiment, the barrier layer is formed of a different material than the first epitaxial material. In an embodiment, forming the first epitaxial material comprises epitaxially growing the first epitaxial material using a first process gas that includes a first precursor and a second precursor, wherein the first precursor comprises a semiconductor material, and the second precursor comprises a dopant, wherein forming the second epitaxial material comprises epitaxially growing the second epitaxial material using a second process gas that includes the first precursor, the second precursor, and a third precursor, wherein the third precursor is different from the first precursor and comprises the semiconductor material. In an embodiment, the first process gas further comprises an etching gas, wherein forming the first epitaxial material further comprises adjusting a ratio between a vertical growth rate of the first epitaxial material and a horizontal growth rate of the first epitaxial material by adjusting a ratio between a flow rate of the first precursor and a flow rate of the etching gas. In an embodiment, the semiconductor material is silicon, and the dopant is phosphorus. In an embodiment, the first precursor is $SiH_2CO_2$, the second precursor is $PH_4$, and the third precursor is $SiH_4$.

In accordance with an embodiment, a method of forming a fin field-effect transistor (FinFET) device includes: forming a first fin and a second fin over a substrate; forming a gate structure over the first fin and the second fin; performing an etching process to from a first recess and a second recess in the first fin and the second fin, respectively; forming a barrier layer in the first recess and the second recess; forming a first epitaxial layer over the barrier layer in the first recess and the second recess, wherein the first epitaxial layer comprises two discrete portions, wherein a first portion of the two discrete portions is formed over the first fin, and a second portion of the two discrete portions is formed over the second fin; forming a second epitaxial layer over the first epitaxial layer, wherein the second epitaxial layer extends continuously from the first fin to the second fin; and forming a capping layer over the second epitaxial layer, wherein chemical compositions of the first epitaxial layer, the second epitaxial layer, and the capping layer include a same semiconductor material and a same dopant but with different concentrations for the dopant. In an embodiment, the semiconductor material is silicon, and the dopant is phosphorous. In an embodiment, forming the first epitaxial layer comprises performing a first epitaxial process using a first silicon-containing precursor and a second phosphorous-containing precursor, wherein forming the second epitaxial layer comprises performing a second epitaxial process using the first silicon-containing precursor, the second phosphorous-containing precursor, and a third silicon-containing precursor different from the first silicon-containing precursor. In an embodiment, a first concentration of the dopant in the first epitaxial layer is lower than a second concentration of the dopant in the second epitaxial layer, wherein a third concentration of the dopant in the capping layer is lower than the first concentration of the dopant in the first epitaxial layer. In an embodiment, the first epitaxial layer and the second epitaxial layer are formed by a first epitaxial process and a second epitaxial process, respectively, wherein a first vertical growth rate of the first epitaxial process is between about twice and about three times of a first horizontal growth rate of the first epitaxial process, wherein a second vertical growth rate of the second epitaxial process is substantially the same as a second horizontal growth rate of the second epitaxial process.

In accordance with an embodiment, a fin field-effect transistor (FinFET) device includes: a first fin and a second fin that protrude above a substrate; a gate structure over the first fin and the second fin; and a source/drain region on a first side of the gate structure over the first fin and the second fin, comprising: a first epitaxial material having a first portion over the first fin and having a second portion over the second fin, wherein the first portion is spaced apart from the second portion; a second epitaxial material over the first epitaxial material, wherein the second epitaxial material extends along exterior surfaces of the first portion and the second portion of the first epitaxial material, wherein the second epitaxial material extends continuously from the first fin to the second fin; and a capping layer over the second epitaxial material, wherein each of the first epitaxial material, the second epitaxial material, and the capping layer comprises a semiconductor material and a dopant, wherein a first concentration of the dopant in the first epitaxial material is lower than a second concentration of the dopant in the second epitaxial material, wherein a third concentration of the dopant in the capping layer is lower than the first concentration of the dopant in the first epitaxial material. In an embodiment, the semiconductor material is silicon, and the dopant is phosphorous. In an embodiment, the FinFET device further includes: first fin spacers along sidewalls of the first fin; second fin spacers along sidewalls of the second fin; and a barrier layer having a first portion between the first fin spacers and having a second portion between the second fin spacers, wherein the first portion of the barrier layer is between the first fin and the first portion of the first epitaxial material, and the second portion of the barrier layer is between the second fin and the second portion of the first epitaxial material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a fin field-effect transistor (FinFET) device, the method comprising:
    forming a first fin and a second fin that protrude above a substrate;
    forming a gate structure over the first fin and the second fin;
    forming, on a first side of the gate structure, a first recess and a second recess in the first fin and the second fin, respectively; and
    forming a source/drain region in the first recess and the second recess, comprising:
        forming a barrier layer in the first recess and the second recess;
        forming a first epitaxial material over the barrier layer in the first recess and the second recess, wherein a first portion of the first epitaxial material over the first fin is spaced apart from a second portion of the first epitaxial material over the second fin;
        forming a second epitaxial material over the first epitaxial material, wherein the second epitaxial material extends along exterior surfaces of the first portion and the second portion of the first epitaxial material, wherein the second epitaxial material extends continuously from the first fin to the second fin; and
        forming a capping layer over the second epitaxial material, wherein each of the first epitaxial material, the second epitaxial material, and the capping layer comprises a semiconductor material and a dopant, wherein a second concentration of the dopant in the second epitaxial material is higher than a first concentration of the dopant in the first epitaxial material, wherein a third concentration of the dopant in the capping layer is lower than the first concentration of the dopant in the first epitaxial material.

2. The method of claim 1, wherein the second epitaxial material has a third portion extending along a first sidewall of the first portion of the first epitaxial material, the first sidewall facing the second portion of the first epitaxial material, and wherein the second epitaxial material has a fourth portion extending along a second sidewall of the second portion of the first epitaxial material, the second sidewall facing the first portion of the first epitaxial material, wherein after forming the second epitaxial material, there is an air gap between the third portion and the fourth portion of the second epitaxial material.

3. The method of claim 1, wherein forming the first recess and the second recess comprises performing an etching process to remove a first portion of the first fin and a second portion of the second fin, wherein the etching process recesses first fin spacers disposed along sidewalls of the first fin and recesses second fin spacers disposed along sidewalls of the second fin.

4. The method of claim 3, wherein the first epitaxial material extends further from the substrate than the recessed first fin spacers and the recessed second fin spacers.

5. The method of claim 1, wherein the capping layer extends continuously along an upper surface of the second epitaxial material from the first fin to the second fin.

6. The method of claim 1, wherein the barrier layer comprises the semiconductor material and the dopant, wherein a fourth concentration of the dopant in the barrier layer is lower than the first concentration of the dopant in the first epitaxial material.

7. The method of claim 1, wherein the barrier layer is formed of a different material than the first epitaxial material.

8. The method of claim 1, wherein forming the first epitaxial material comprises epitaxially growing the first epitaxial material using a first process gas that includes a first precursor and a second precursor, wherein the first precursor comprises a semiconductor material, and the second precursor comprises a dopant, wherein forming the second epitaxial material comprises epitaxially growing the second epitaxial material using a second process gas that includes the first precursor, the second precursor, and a third precursor, wherein the third precursor is different from the first precursor and comprises the semiconductor material.

9. The method of claim 8, wherein the first process gas further comprises an etching gas, wherein forming the first epitaxial material further comprises adjusting a ratio between a vertical growth rate of the first epitaxial material and a horizontal growth rate of the first epitaxial material by adjusting a ratio between a flow rate of the first precursor and a flow rate of the etching gas.

10. The method of claim 8, wherein the semiconductor material is silicon, and the dopant is phosphorus.

11. The method of claim 10, wherein the first precursor is $SiH_2CO_2$, the second precursor is $PH_4$, and the third precursor is $SiH_4$.

12. A method of forming a fin field-effect transistor (FinFET) device, the method comprising:
forming a first fin and a second fin over a substrate;
forming a gate structure over the first fin and the second fin;
performing an etching process to form a first recess and a second recess in the first fin and the second fin, respectively;
forming a barrier layer in the first recess and the second recess;
forming a first epitaxial layer over the barrier layer in the first recess and the second recess, wherein the first epitaxial layer comprises two discrete portions, wherein a first portion of the two discrete portions is formed over the first fin, and a second portion of the two discrete portions is formed over the second fin;
forming a second epitaxial layer over the first epitaxial layer, wherein the second epitaxial layer extends continuously from the first fin to the second fin, wherein the first epitaxial layer and the second epitaxial layer are formed by a first epitaxial process and a second epitaxial process, respectively, wherein a first vertical growth rate of the first epitaxial process is between about twice and about three times of a first horizontal growth rate of the first epitaxial process, wherein a second vertical growth rate of the second epitaxial process is substantially the same as a second horizontal growth rate of the second epitaxial process; and
forming a capping layer over the second epitaxial layer, wherein chemical compositions of the first epitaxial layer, the second epitaxial layer, and the capping layer include a same semiconductor material and a same dopant but with different concentrations for the dopant.

13. The method of claim 12, wherein the semiconductor material is silicon, and the dopant is phosphorous.

14. The method of claim 13, wherein forming the first epitaxial layer comprises performing a first epitaxial process using a first silicon-containing precursor and a second phosphorous-containing precursor, wherein forming the second epitaxial layer comprises performing a second epitaxial process using the first silicon-containing precursor, the second phosphorous-containing precursor, and a third silicon-containing precursor different from the first silicon-containing precursor.

15. The method of claim 12, wherein a first concentration of the dopant in the first epitaxial layer is lower than a second concentration of the dopant in the second epitaxial layer, wherein a third concentration of the dopant in the capping layer is lower than the first concentration of the dopant in the first epitaxial layer.

16. The method of claim 12, wherein the barrier layer is formed of a material having a different chemical composition than the first epitaxial layer.

17. A fin field-effect transistor (FinFET) device comprising:
a first fin and a second fin that protrude above a substrate;
a gate structure over the first fin and the second fin; and
a source/drain region on a first side of the gate structure over the first fin and the second fin, comprising:
a first epitaxial material having a first portion over the first fin and having a second portion over the second fin, wherein the first portion is spaced apart from the second portion;
a second epitaxial material over the first epitaxial material, wherein the second epitaxial material extends along exterior surfaces of the first portion and the second portion of the first epitaxial material, wherein the second epitaxial material extends continuously from the first fin to the second fin; and
a capping layer over the second epitaxial material, wherein each of the first epitaxial material, the second epitaxial material, and the capping layer comprises a semiconductor material and a dopant, wherein a first concentration of the dopant in the first epitaxial material is lower than a second concentration of the dopant in the second epitaxial material, wherein a third concentration of the dopant in the capping layer is lower than the first concentration of the dopant in the first epitaxial material.

18. The FinFET device of claim 17, wherein the semiconductor material is silicon, and the dopant is phosphorous.

19. The FinFET device of claim 17, further comprising:
first fin spacers along sidewalls of the first fin;
second fin spacers along sidewalls of the second fin; and
a barrier layer having a first portion between the first fin spacers and having a second portion between the second fin spacers, wherein the first portion of the barrier layer is between the first fin and the first portion of the first epitaxial material, and the second portion of the barrier layer is between the second fin and the second portion of the first epitaxial material.

20. The FinFET device of claim 17, further comprising:
an isolation region between the first fin and the second fin; and
an air gap, wherein the air gap is vertically disposed between the second epitaxial material and the isolation region, and is laterally disposed between a first portion of the second epitaxial material around the first fin and a second portion of the second epitaxial material around the second fin, wherein a height of the air gap, measured along a first direction perpendicular to a major upper surface of the substrate, is between about 60% and about 80% of a first fin height of the first fin, wherein the first fin height is measured along the first direction.

* * * * *